(12) United States Patent
Achi

(10) Patent No.: US 11,581,460 B2
(45) Date of Patent: Feb. 14, 2023

(54) LIGHT EMITTING MODULE AND METHOD FOR MANUFACTURING LIGHT EMITTING MODULE

(71) Applicant: NICHIA CORPORATION, Anan (JP)

(72) Inventor: Yusaku Achi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 191 days.

(21) Appl. No.: 17/133,359

(22) Filed: Dec. 23, 2020

(65) Prior Publication Data

US 2021/0202805 A1  Jul. 1, 2021

(30) Foreign Application Priority Data

Dec. 25, 2019 (JP) .............................. JP2019-233639
Jun. 25, 2020 (JP) .............................. JP2020-109609

(51) Int. Cl.
*H01L 33/58* (2010.01)
*H01L 33/00* (2010.01)
*F21V 8/00* (2006.01)

(52) U.S. Cl.
CPC ............ *H01L 33/58* (2013.01); *G02B 6/0065* (2013.01); *H01L 33/005* (2013.01); *H01L 2933/0058* (2013.01)

(58) Field of Classification Search
CPC .................... H01L 33/58; H01L 33/005; H01L 2933/0058; G02B 6/0065
See application file for complete search history.

(56) References Cited

U.S. PATENT DOCUMENTS

| 2005/0237765 A1* | 10/2005 | Suehiro ................... H01L 33/54 257/E33.074 |
| 2006/0119250 A1 | 6/2006 | Suehiro et al. |
| 2012/0127754 A1* | 5/2012 | Lin ................... G02F 1/133603 362/609 |

(Continued)

FOREIGN PATENT DOCUMENTS

| JP | 2003332629 A | 11/2003 |
| JP | 2008059786 A | 3/2008 |
| JP | 2012109243 A | 6/2012 |

(Continued)

*Primary Examiner* — Mary Ellen Bowman
(74) *Attorney, Agent, or Firm* — Global IP Counselors, LLP

(57) ABSTRACT

A method for manufacturing a light emitting module includes: providing a light source including a first surface having a pair of electrodes, and a second surface; providing a light guide plate including a first main surface and a second main surface, the light guide plate defining a through-hole extending through the light guide plate from the first main surface to the second main surface, the through-hole having a first penetration portion disposed on a first main surface side, a second penetration portion disposed on a second main surface side, and an intermediate penetration portion connecting the first penetration portion and the second penetration portion, the intermediate penetration portion being narrower in width than the second surface of the light source; and disposing the light source in the second penetration portion of the light guide plate with a joining member being interposed between the light source and the light guide plate.

15 Claims, 24 Drawing Sheets

(56) References Cited

U.S. PATENT DOCUMENTS

2019/0049649 A1    2/2019   Hayashi et al.
2019/0294004 A1    9/2019   Hashimoto

FOREIGN PATENT DOCUMENTS

| JP | 2019012681 A | 1/2019 |
| JP | 2019-175846 A | 10/2019 |
| KR | 20090117419 A | 11/2009 |
| KR | 10-2010-0112978 A | 10/2010 |

* cited by examiner

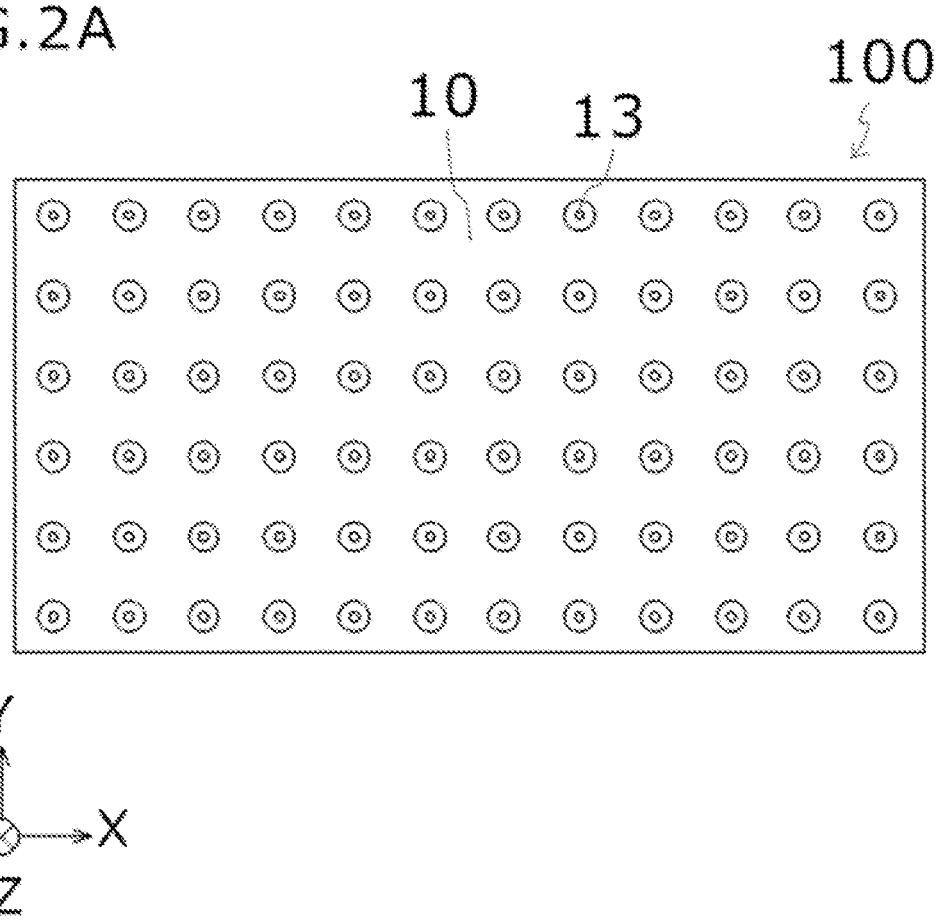

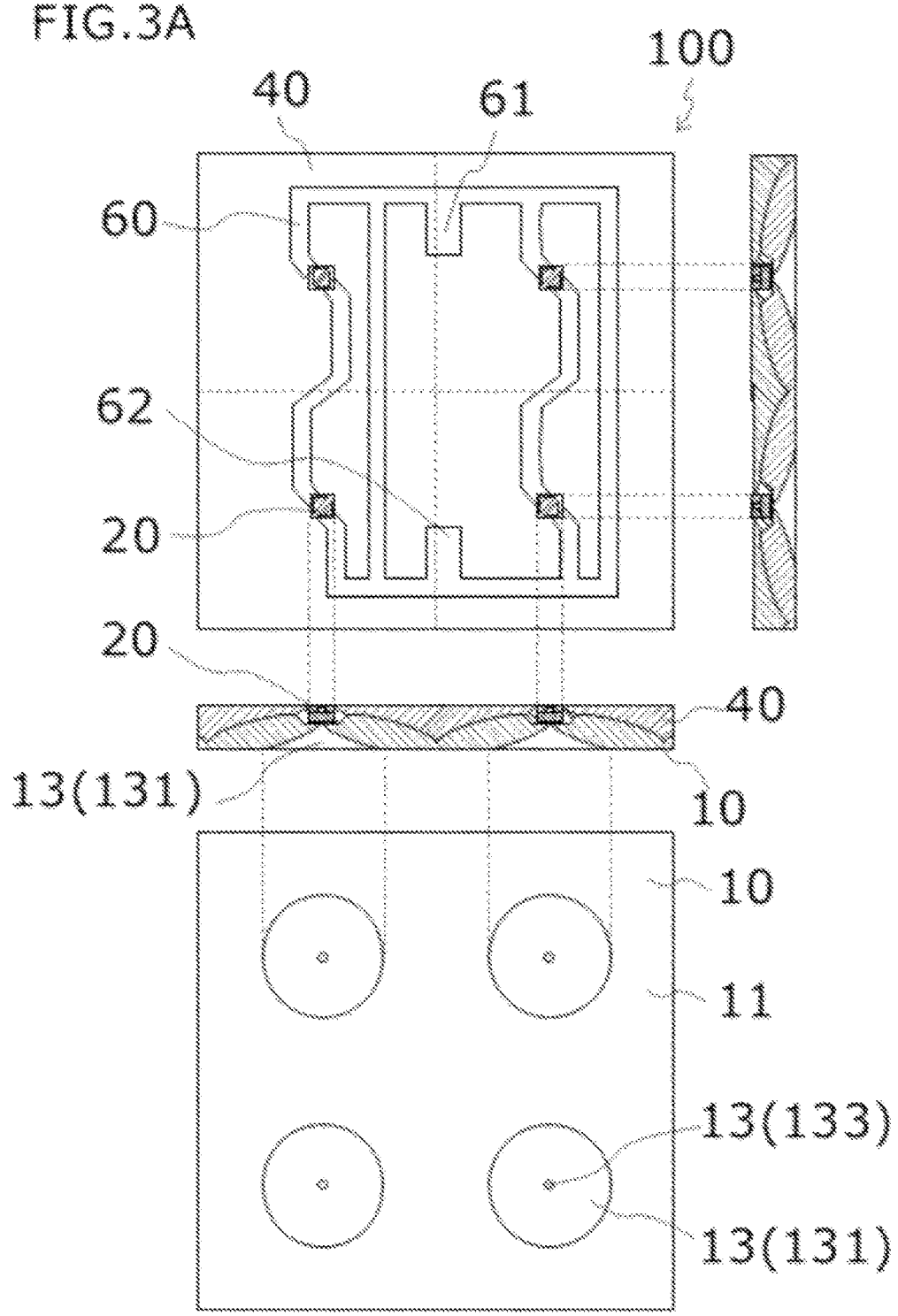

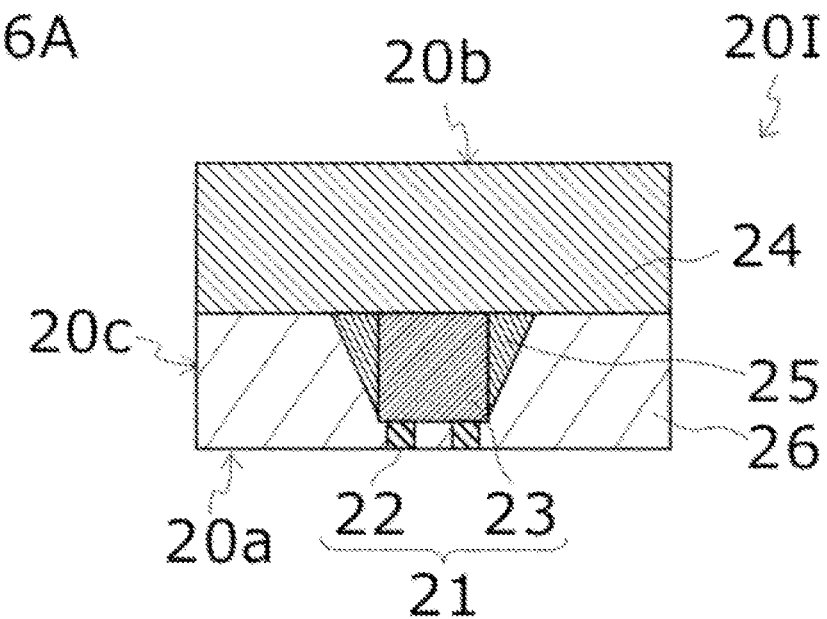
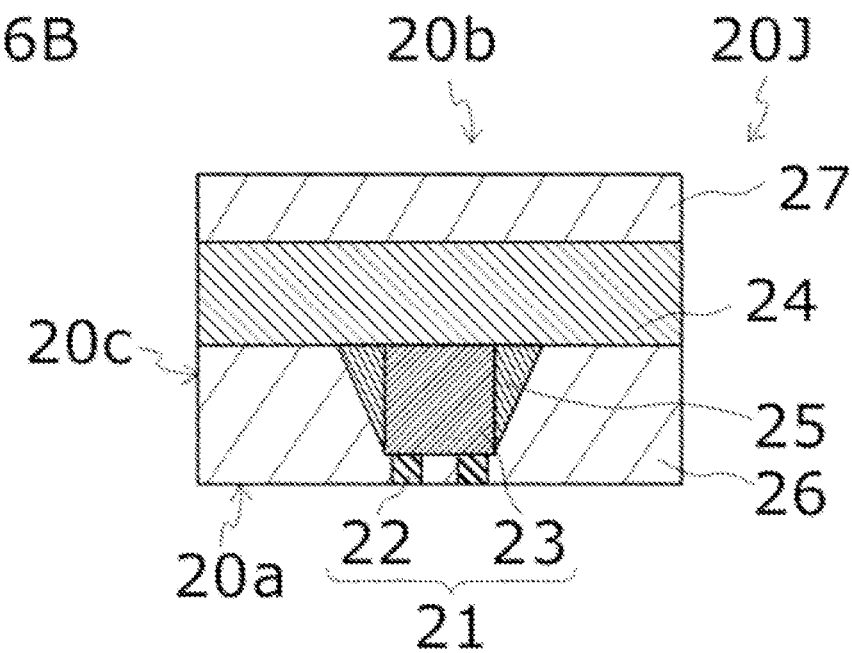

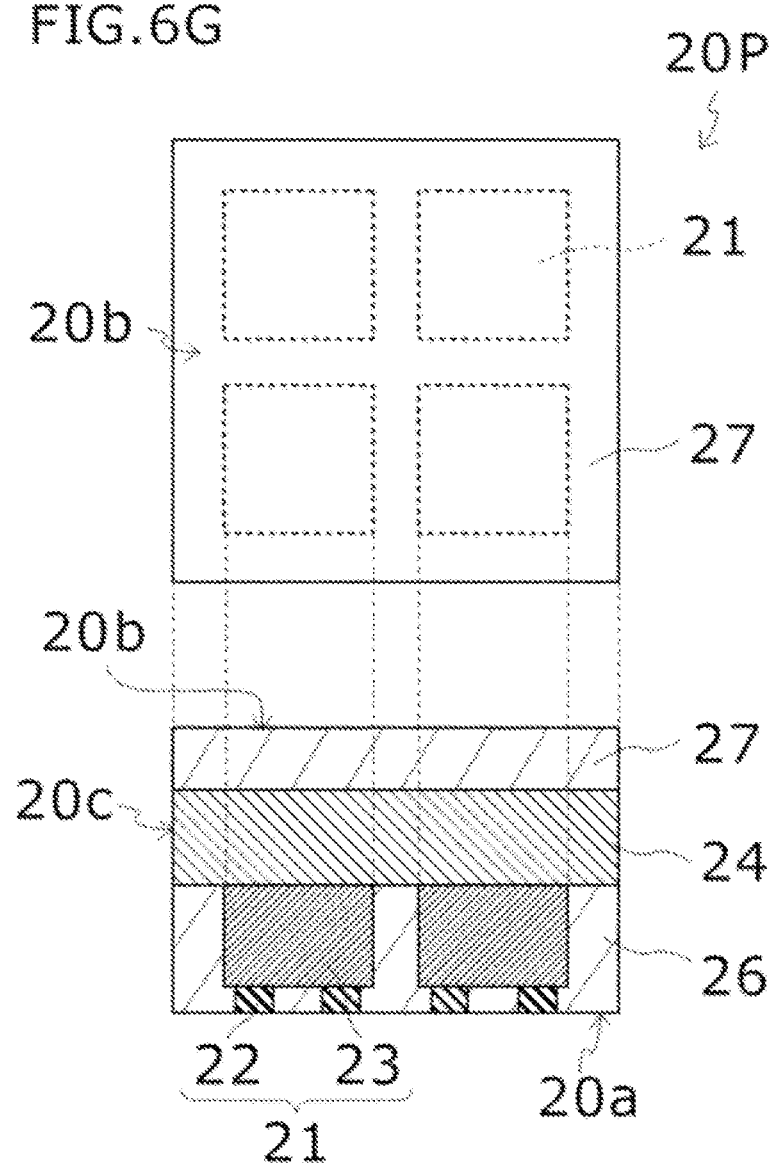

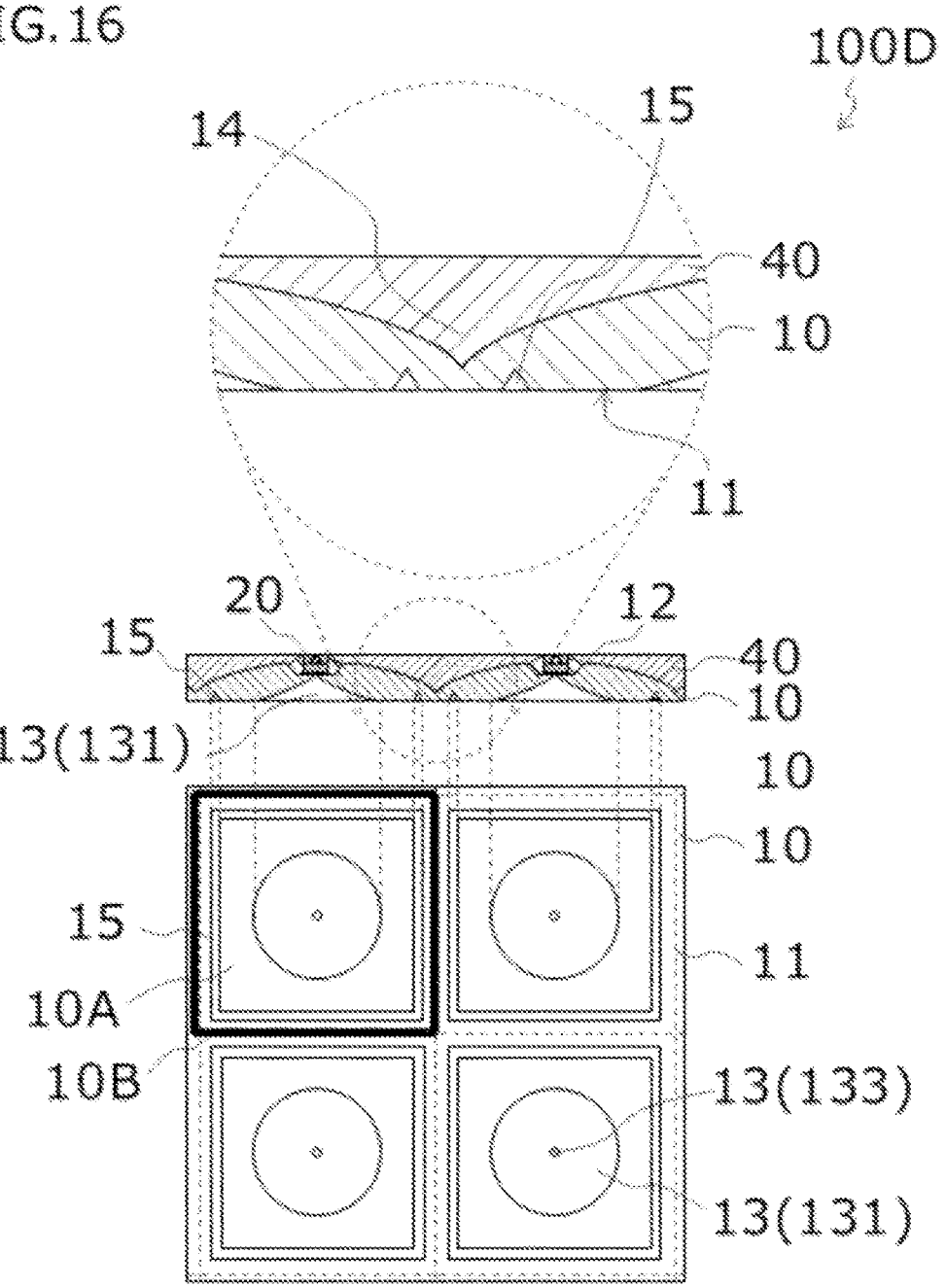

LIGHT EMITTING MODULE AND METHOD FOR MANUFACTURING LIGHT EMITTING MODULE

CROSS-REFERENCE TO RELATED APPLICATION

This application claims priority to Japanese Patent Application No. 2019-233639 filed on Dec. 25, 2019 and Japanese Patent Application No. 2020-109609, filed on Jun. 25, 2020. The entire disclosures of Japanese Patent Application Nos. 2019-233639 and 2020-109609 are hereby incorporated herein by reference.

BACKGROUND

1. Technical Field

The present disclosure relates to a light emitting module and a method for manufacturing a light emitting module.

2. Description of Related Art

Planar light emitting modules that feature semiconductor light emitting elements are known (For Example, see KR10-2009-0117419A and JP2019-12681A).

SUMMARY

One object of the present disclosure is to provide a light emitting module that can be made thinner, and a method for manufacturing the light emitting module.

According to one embodiment of the present disclosure, a method for manufacturing a light emitting module includes: providing a light source including a first surface having a pair of electrodes, and a second surface on an opposite side from the first surface; providing a light guide plate including a first main surface and a second main surface on an opposite side from the first main surface, the light guide plate defining a through-hole extending through the light guide plate from the first main surface to the second main surface, the through-hole having a first penetration portion disposed on a first main surface side, a second penetration portion disposed on a second main surface side, and an intermediate penetration portion connecting the first penetration portion and the second penetration portion, the intermediate penetration portion being narrower in width than the second surface of the light source; and disposing the light source in the second penetration portion of the light guide plate with a joining member being interposed between the light source and the light guide plate.

According to another embodiment of the present disclosure, a light emitting module includes a light source, a light guide plate, and a joining member. The light source includes a first surface having a pair of electrodes, and a second surface on an opposite from the first surface. The light guide plate includes a first main surface, and a second main surface on an opposite side from the first main surface, the light guide plate defining a through-hole extending through the light guide plate from the first main surface to the second main surface. The through-hole has a first penetration portion disposed on a first main surface side, a second penetration portion disposed on a second main surface side, and an intermediate penetration portion connecting the first penetration portion and the second penetration portion. The intermediate penetration portion is narrower in width than the second surface of the light source. The joining member joining the light source and the light guide plate in the second penetration portion.

According to certain embodiments of the present invention, a light emitting module made thinner can be provided.

BRIEF DESCRIPTION OF THE DRAWINGS

FIG. 2A is a schematic plan view showing an example of a light emitting module according to an embodiment of the present disclosure.

FIG. 3A is a schematic plan view, a schematic bottom view, and a schematic cross-sectional view showing an example of the light emitting module according to a first embodiment of the present disclosure.

FIG. 6A is a schematic cross-sectional view showing a modified example of a light source according to the first embodiment of the present disclosure.

FIG. 6B is a schematic cross-sectional view showing a modified example of a light source according to the first embodiment of the present disclosure.

FIG. 6G is a schematic cross-sectional view showing a modified example of a light source according to the first embodiment of the present disclosure.

FIG. 16 is a partially enlarged schematic cross-sectional view and a schematic bottom view showing a modified example of the light emitting module according to the first embodiment of the present disclosure.

DETAILED DESCRIPTION

Figure 1:
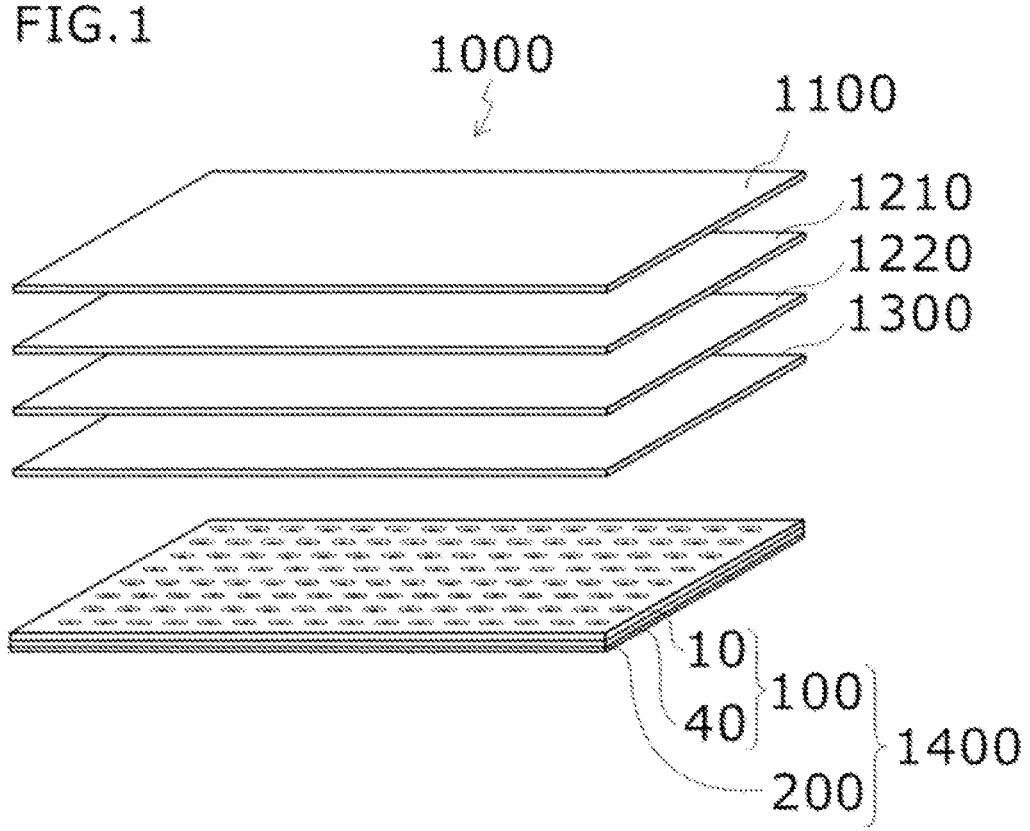
FIG. 1 is a configuration diagram showing the components of a liquid crystal display device according to an embodiment of the present disclosure.

The present disclosure will now be described in detail with reference to the drawings. In the following description, terms indicating a specific direction or position (such as "upper," "lower," and other terms including those concepts) will be used as necessary, but the use of these terms is intended to facilitate an understanding of the invention with reference to the drawings, and the technical scope of the invention is not limited by the meanings of these terms. Also, components that are numbered the same in two or more drawings indicate the same or equivalent portions or members. In addition, the same name will be used for each member even in the case where the state, shape, etc., are different before and after curing, before and after cutting, and so forth.

Furthermore, the embodiments described below are examples of a light emitting module and are given for embodying the technical idea of the present invention, and the present invention is not limited to the following. Also, the dimensions, materials, shapes, relative layouts, and so on of the components described below are not intended to limit the scope of the present invention, unless specified otherwise, and are merely intended to be examples. Also, what is described in one embodiment or working example can be applied to other embodiments and working examples. In addition, the sizes, positional relationships, and so forth of members shown in the drawings may be exaggerated in order to make the description clearer.

Liquid Crystal Display Device 1000

FIG. 1 is a configuration diagram showing the components of a liquid crystal display device 1000 according to this embodiment. The liquid crystal display device 1000 shown in FIG. 1 includes a liquid crystal panel 1100, two lens sheets 1210 and 1220, a diffusion sheet 1300, and a planar light source 1400, in that order starting from the top. The liquid crystal display device 1000 according to this embodiment is a so-called direct type liquid crystal display device 1000 in which the planar light source 1400 is disposed under the liquid crystal panel 1100. The liquid crystal display device 1000 irradiates the liquid crystal panel 1100 with the light emitted from a light emitting module 100. In addition to the above-mentioned constituent members, members such as a polarizing film, a color filter, and a DBEF may also be provided. The number in which these various optical members are used and the order in which they are stacked can be selected as needed.

Planar Light Source

The planar light source 1400 includes at least one light emitting module 100 and at least one wiring board 200. The number, size, layout, etc., or the light emitting modules and wiring boards can be selected according to the size of the liquid crystal panel 1100, the planar light source 1400, and so forth.

Light Emitting Module

Figure 2B:
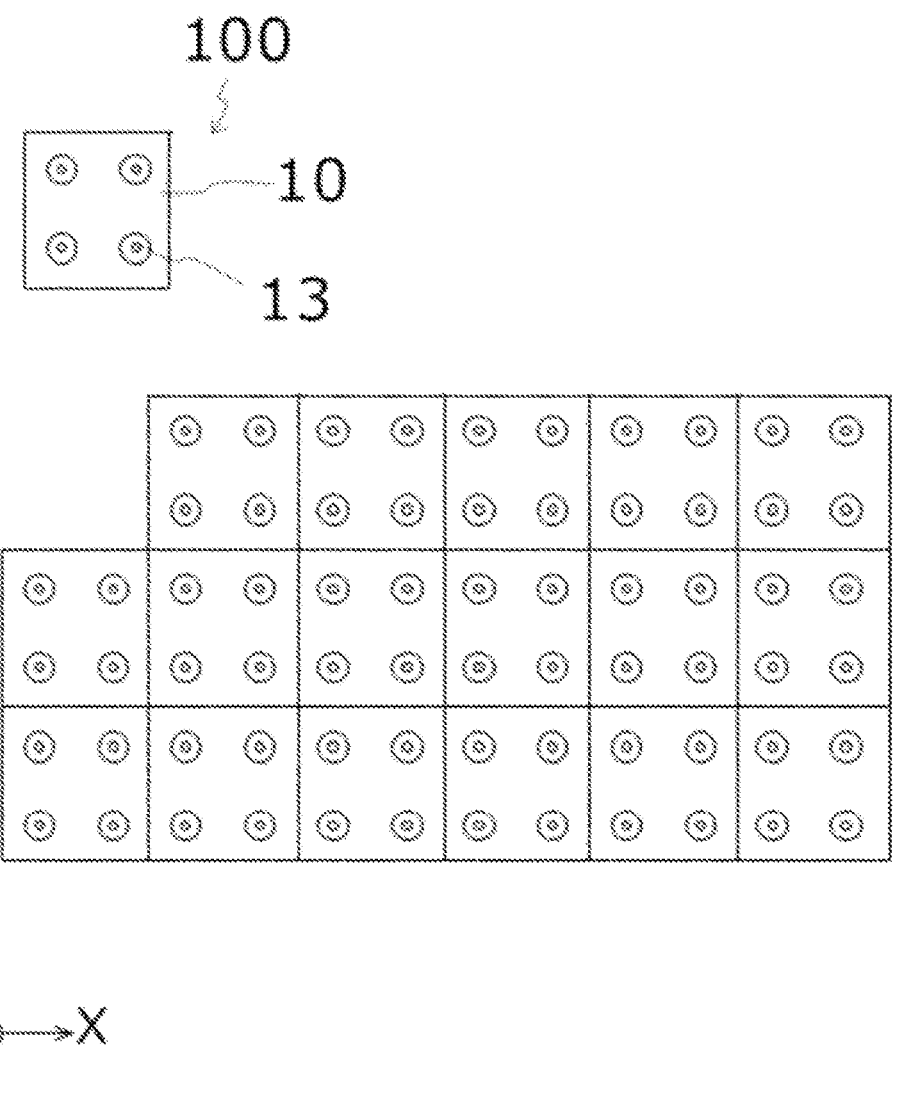
FIG. 2B is a schematic plan view showing an example of a light emitting module according to an embodiment of the present disclosure.

The light emitting module 100 shown in FIG. 2A is an example in which the light emitting module 100 is substantially the same size as the planar light source 1400, and one planar light source 1400 includes one light emitting module 100. Also, the light emitting module 100 shown in FIG. 2B is an example in which the light emitting module 100 is smaller than the planar light source 1400, and one planar light source 1400 includes a plurality of light emitting modules 100. The light emitting module 100 shown in FIG. 2B will be described below as an example.

First Embodiment

Figure 3B:
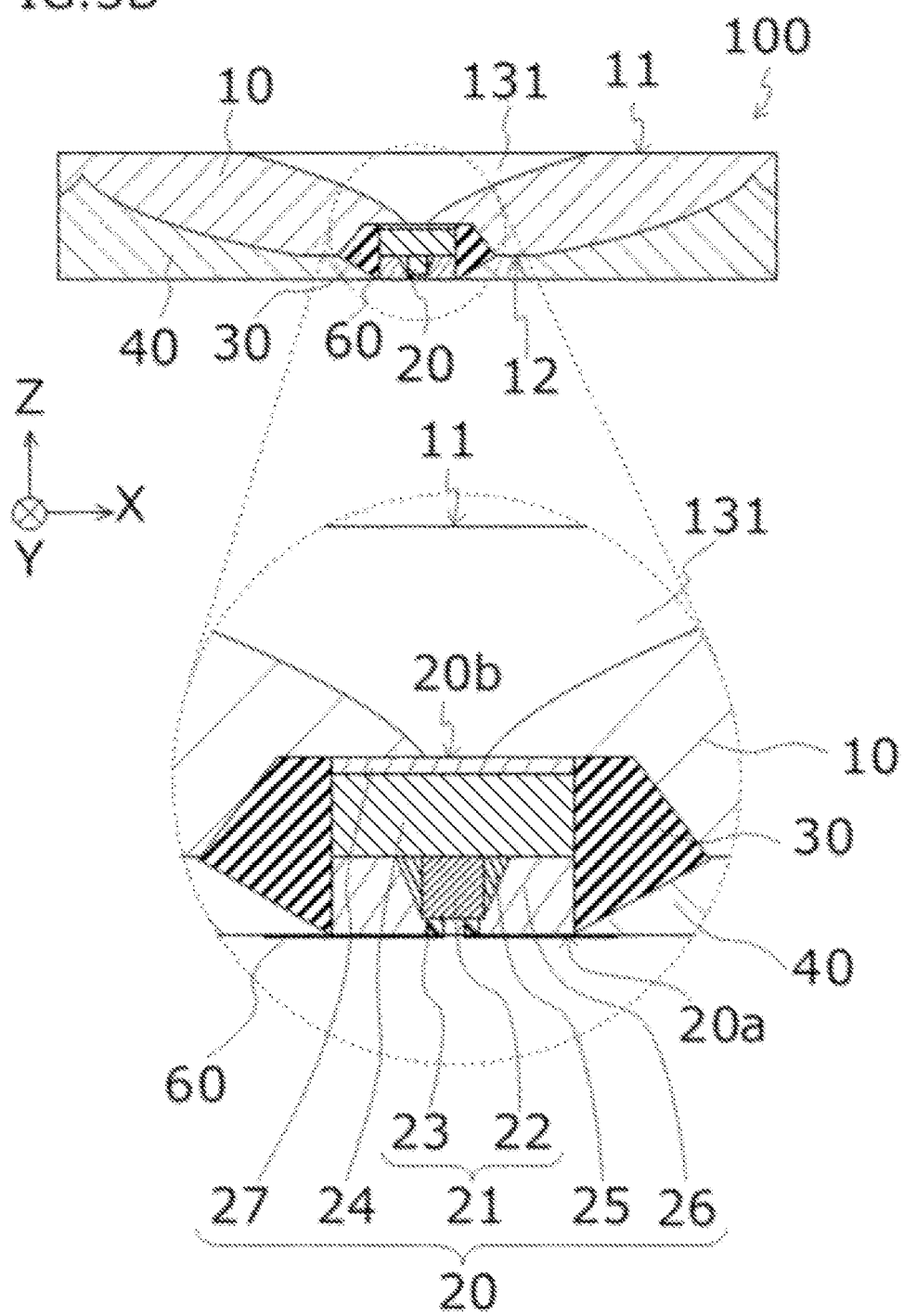
FIG. 3B is partially enlarged schematic cross-sectional views showing an example of the light emitting module according to the first embodiment of the present disclosure.
Figure 4A:
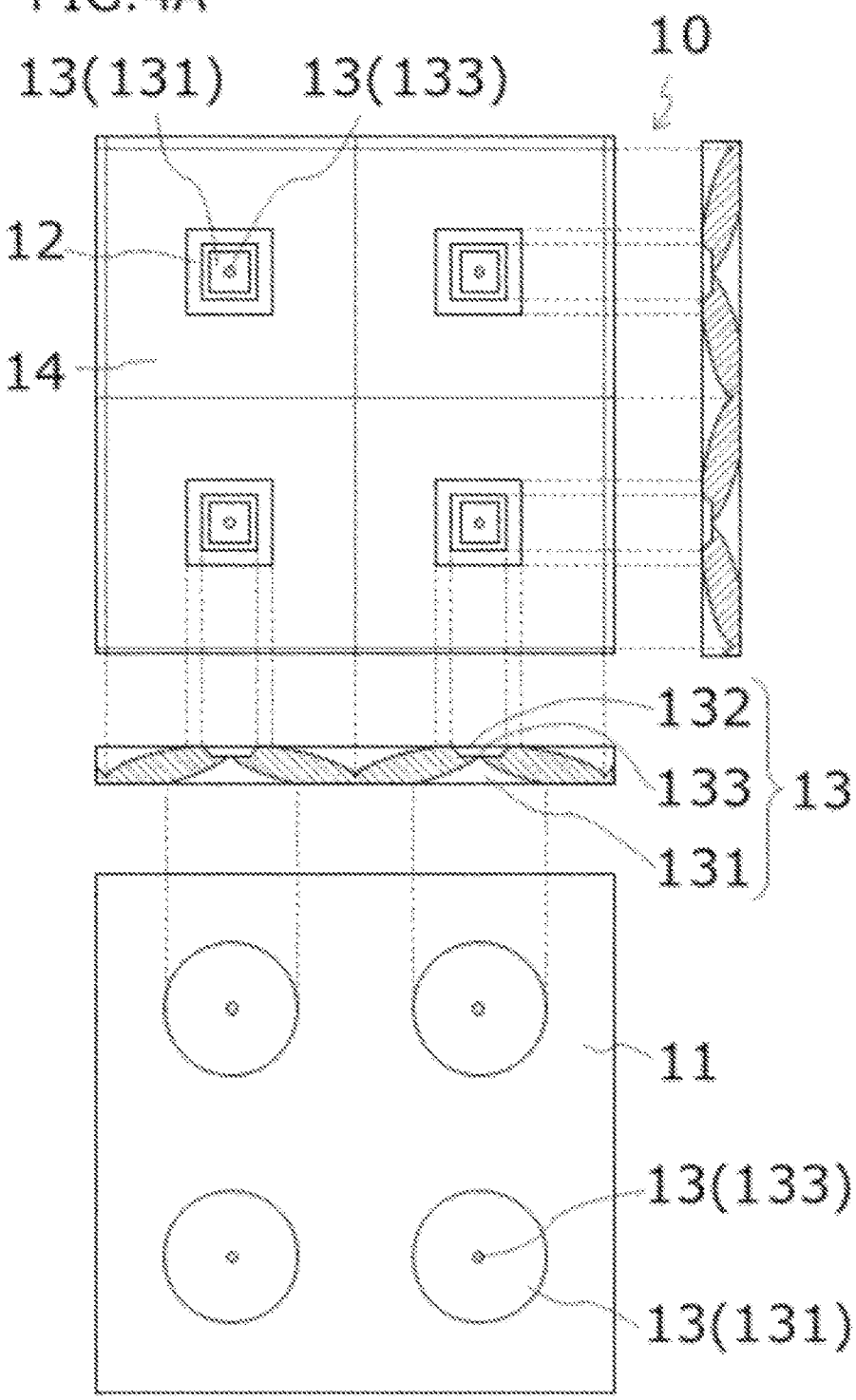
FIG. 4A is a schematic plan view, a schematic bottom view, and a schematic cross-sectional view showing an example of a light guide plate according to the first embodiment of the present disclosure.
Figure 4B:
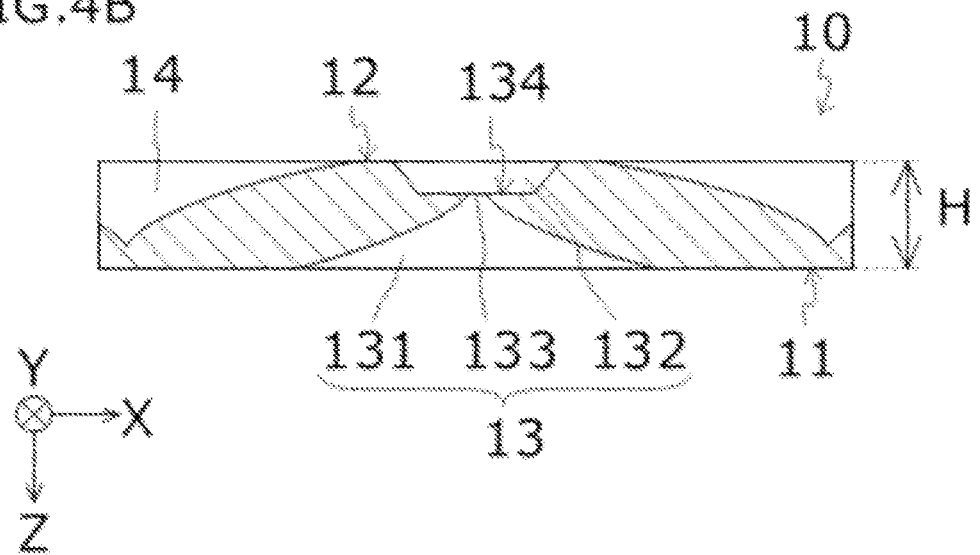
FIG. 4B is a partially enlarged schematic cross-sectional view showing an example of the light guide plate according to the first embodiment of the present disclosure.
Figure 4C:
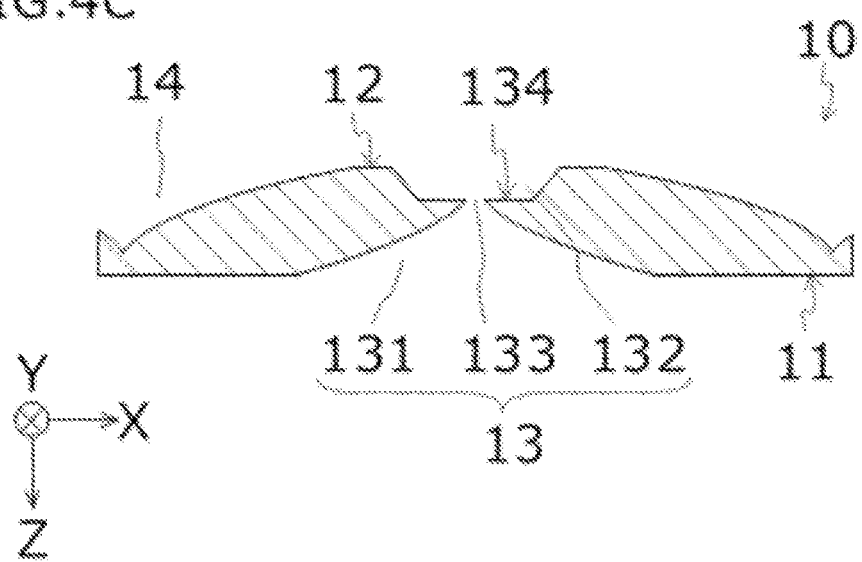
FIG. 4C is an end view of the light guide plate shown in FIG. 4B.

FIGS. 3A and 3B show an example of the light emitting module 100 according to the first embodiment. FIGS. 4A to 4C show an example of the light guide plate 10 used in the light emitting module 100. The light emitting module 100 includes at least one light source 20, the light guide plate 10, and a joining member 30 that joins the light source 20 and the light guide plate 10. The light source 20 includes a first surface 20a including the electrodes 23, and a second surface 20b on the opposite side from the first surface 20a. There are cases where the light source 20 is only a light emitting element, and cases where the light source is a light emitting device including a light emitting element and other members. The light guide plate 10 includes a first main surface 11, a second main surface 12 on the opposite side from the first main surface 11, and a through-hole 13 that goes from the first main surface 11 to the second main surface 12. The through-hole 13 includes a first penetration portion 131 disposed on the first main surface 11 side, and a second penetration portion 132 disposed on the second main surface 12 side.

Furthermore, the through-hole 13 includes an intermediate penetration portion 133 located in between the first penetration portion 131 and the second penetration portion 132, which connects the first penetration portion 131 and the second penetration portion 132. The width (inside diameter) of the intermediate penetration portion 133 is less than the width of the second surface 20b of the light source 20. The light source 20 is disposed inside the second penetration portion 132 of the light guide plate 10. The light source 20 and the light guide plate 10 are joined by the joining member 30.

The intermediate penetration portion 133 and the first penetration portion 131 are disposed above the light source 20. That is, there is a region in which the light guide plate 10 is not present. Consequently, a region that is not affected by the thickness of the light guide plate 10 is formed above the light source 20, and a light emitting module 100 having stable optical characteristics can be obtained.

The light emitting module 100 described above can be obtained by a manufacturing method including the following steps. The method for manufacturing the light emitting module 100 includes a step of providing the light source 20, a step of providing the light guide plate 10, and a step of joining the light source 20 and the light guide plate 10. The order of the steps of providing the light source 20 and providing the light guide plate 10 is not important, and either step may be performed first, or they may be performed at the same time.

The method for manufacturing the light emitting module will now be described in detail.

Step of Preparing Light Source

One or more light sources 20 are prepared. An example of the light source 20 that can be used in the manufacturing method according to this embodiment is a light emitting device that includes only the light emitting element 21, or one that includes the light emitting element 21 and other members, as in the light sources 20A to 20P shown in FIGS. 5A to 5H and 6A to 6G. Such a light source 20 includes a first surface (upper surface) 20a equipped with electrodes 23, and a second surface (upper surface) 20b on the opposite side from the first surface 20a. In the case where a light emitting device is used as the light source, the step of combining the light emitting element 21 and other members can be, for example, to perform some or all of the steps of forming a light adjusting member 27, a light-transmissive member 24, a covering member 26, and the like (discussed below). Alternatively, the light source 20 can be one that is purchased.

Step of Preparing Light Guide Plate

FIGS. 4A to 4C show an example of the light guide plate 10 used in the manufacturing method according to this embodiment in the preparation of the light guide plate. FIG. 4A is a diagram showing the light guide plate 10, which is part of the configuration of the light emitting module 100 shown in FIG. 3A and elsewhere, and shows a plan view, a bottom view, and a cross-sectional view. FIG. 4B is an enlarged cross-sectional view in which a part of the light guide plate 10 shown in FIG. 4A has been enlarged. FIG. 4B is an enlarged cross-sectional diagram including the through-hole 13, and, in order to facilitate understanding, FIG. 4C shows an end view at the cross-sectional plane corresponding to the cross-sectional view shown in FIG. 4B.

The light guide plate 10 includes the first main surface 11 serving as a light extraction surface, and the second main surface 12 on the opposite side from the first main surface 11. The light guide plate 10 includes one or more through-holes 13 that go from the first main surface 11 to the second main surface 12. Here, an example is given in which one light guide plate 10 includes four through-holes 13.

This light guide plate 10 can be prepared, for example, by injection molding, transfer molding, thermal transfer, or another such molding method. Also, the through-holes 13 of the light guide plate 10, and a concave portion 14 and the like (discussed below) can be formed all at once in a metal mold during the molding of the light guide plate 10. This reduces misalignment during molding. Also, the light guide plate 10 may be prepared by purchasing or preparing a light-transmissive plate that does not have the through-holes 13 or the recesses 14, and machining this plate. Alternatively, the plate may be prepared by purchasing a light guide plate 10 already having the through-holes 13 and the recesses 14.

The through-hole 13 includes the first penetration portion 131 on the first main surface 11 side, the second penetration portion 132 on the second main surface 12 side, and the intermediate penetration portion 133 that connects the first penetration portion 131 and the second penetration portion 132.

Step of Joining Light Source and Light Guide Plate

Figure 7A:
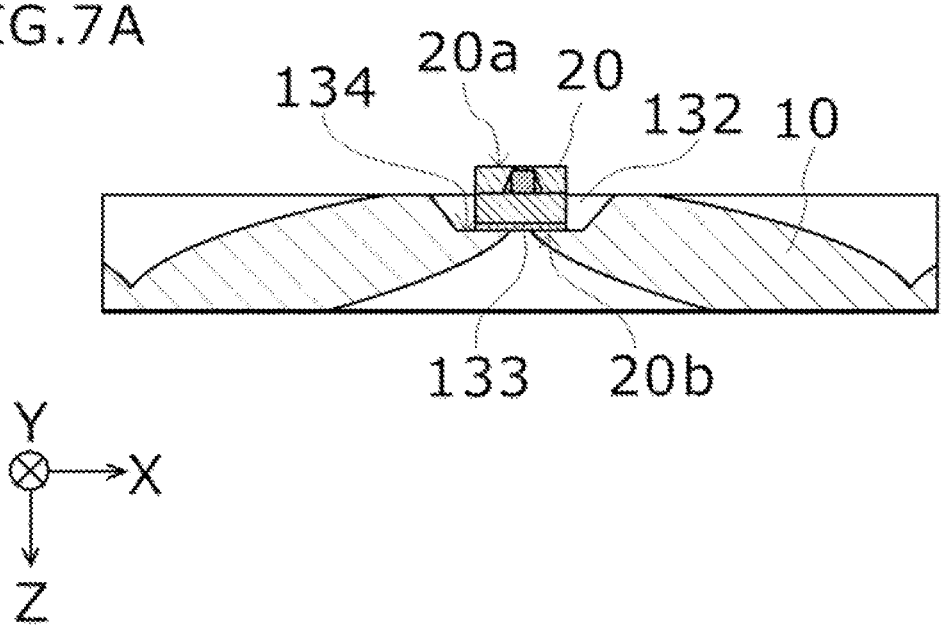
FIG. 7A is a partially enlarged schematic cross-sectional view showing an example of the steps for manufacturing the light emitting module according to the first embodiment of the present disclosure.
Figure 7B:
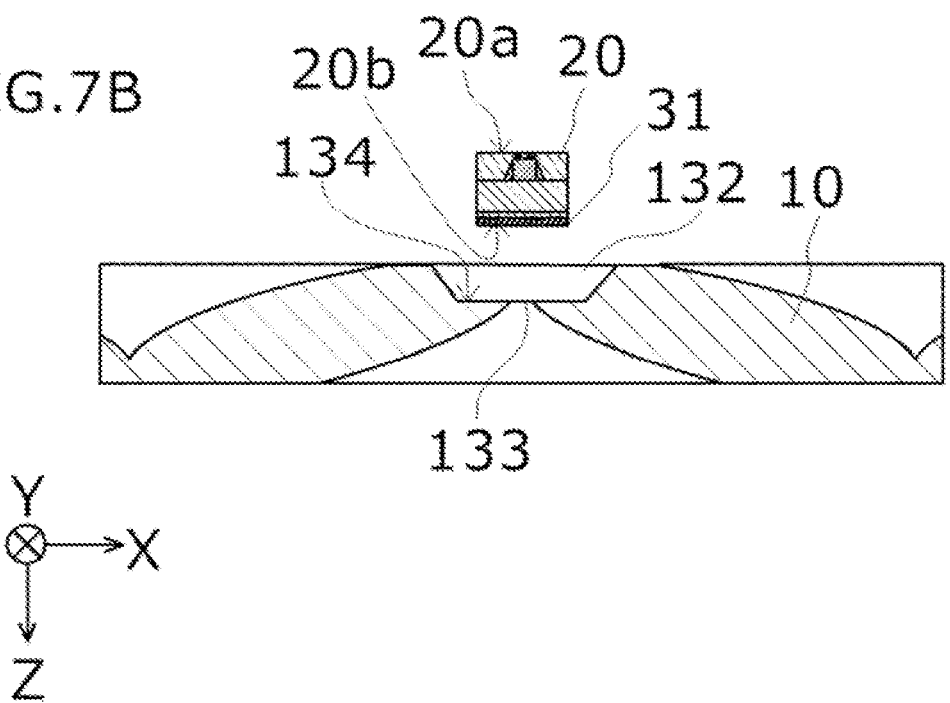
FIG. 7B is a partially enlarged schematic cross-sectional view showing an example of the steps for manufacturing the light emitting module according to the first embodiment of the present disclosure.

The light guide plate 10 is placed on a work table or the like, with the second main surface 12 side facing up, for example. As shown in FIG. 7A, the light source 20 is disposed in the second penetration portion 132 so as to block off the intermediate penetration portion 133. Here, the surface corresponding to the bottom surface of the second penetration portion 132 (concave portion) and surrounding the intermediate penetration portion 133 (the bottom surface of the concave portion) will be referred to as a third surface 134. The light source 20 is disposed on the third surface 134 of the second penetration portion 132. An example of using a light source 20 whose height is greater than the depth of the second penetration portion 132 will be given here. Therefore, part of the light source 20 is located outside the second penetration portion 132.

The joining member 30 may be disposed on the second surface 20b of the light source 20. For example, a method can be used in which the light source 20 is picked up with a suction member such as a suction collet, and the second surface 20b of the light source 20 is dipped in a liquid joining member to affix the joining member 30 (second joining member 31). In the case where the joining member 30 is disposed on the light source 20 side, the joining member 30 may or may not be disposed on the light guide plate 10.

Figure 8:
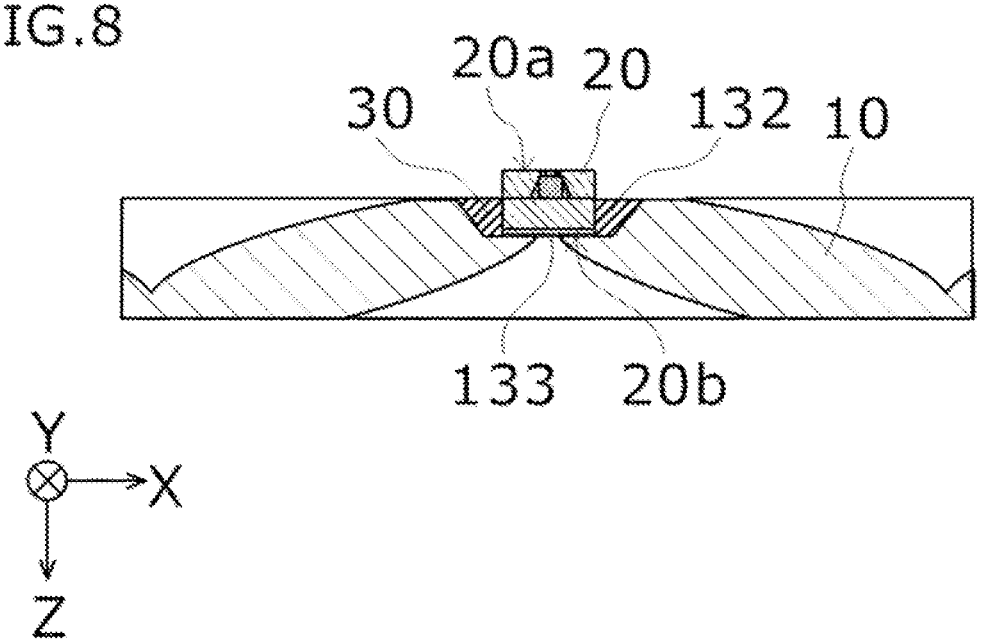
FIG. 8 is a partially enlarged schematic cross-sectional view showing an example of the steps for manufacturing the light emitting module according to the first embodiment of the present disclosure.

Next, as shown in FIG. 8, the joining member 30 is disposed so as to fill in the space between the inner surface of the second penetration portion 132 and the light source 20. A liquid resin material or the like can be used as the joining member 30. Here, the term "liquid" refers to a fluid state, and encompasses a paste, a gel, and the like. In the case where a liquid joining member 30 is used, it can be formed by potting, transfer, printing, jet dispensing, or another such method.

Figure 9:
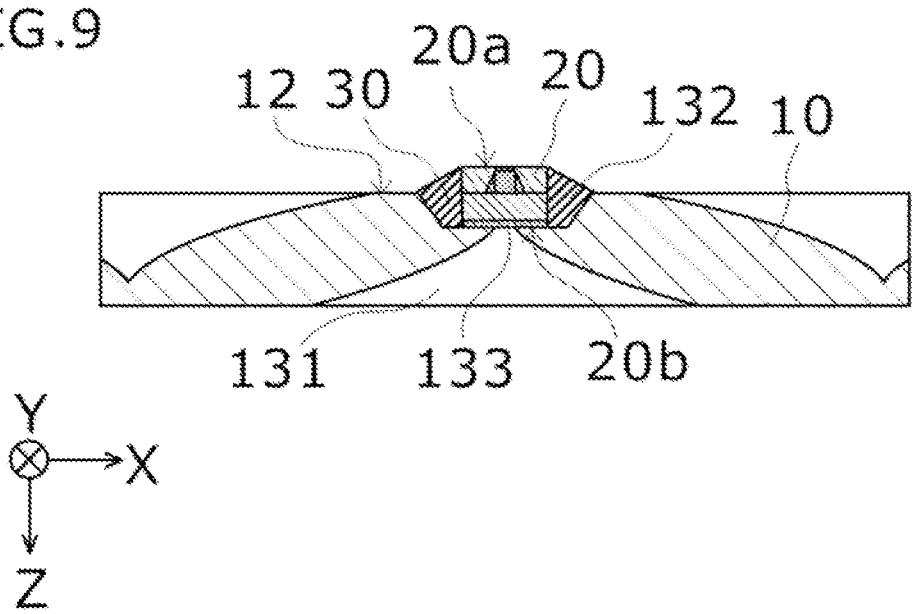
FIG. 9 is a partially enlarged schematic cross-sectional view showing an example of the steps for manufacturing the light emitting module according to the first embodiment of the present disclosure.

The amount of the joining member 30 can be set, for example, to be the amount disposed in only in the second penetration portion 132, as shown in FIG. 8. Alternatively, as shown in FIG. 9, the joining member 30 can be disposed at a position higher than the opening of the second penetration portion 132, that is, the second main surface 12 of the light guide plate 10. Alternatively, the joining member 30 may have a portion that is lower than the opening of the second penetration portion 132, that is, the second main surface 12 of the light guide plate 10. In particular, in the case where the height of the light source 20 is greater than the depth of the second penetration portion 132, the joining member 30 can be disposed so as to creep up to the side surface of the light source 20 located higher than the opening of the second penetration portion 132, which increases the joint strength between the light guide plate 10 and the light source 20. Allowing the joining member 30 to creep up means that the side surface of the joining member 30 located further to the outside than the second main surface 12 of the light guide plate 10 becomes an inclined surface. This allows the light emitted from the side of the light source 20 to be efficiently reflected to the light guide plate 10 side.

Step of Forming Light Reflective Member

Figure 10:
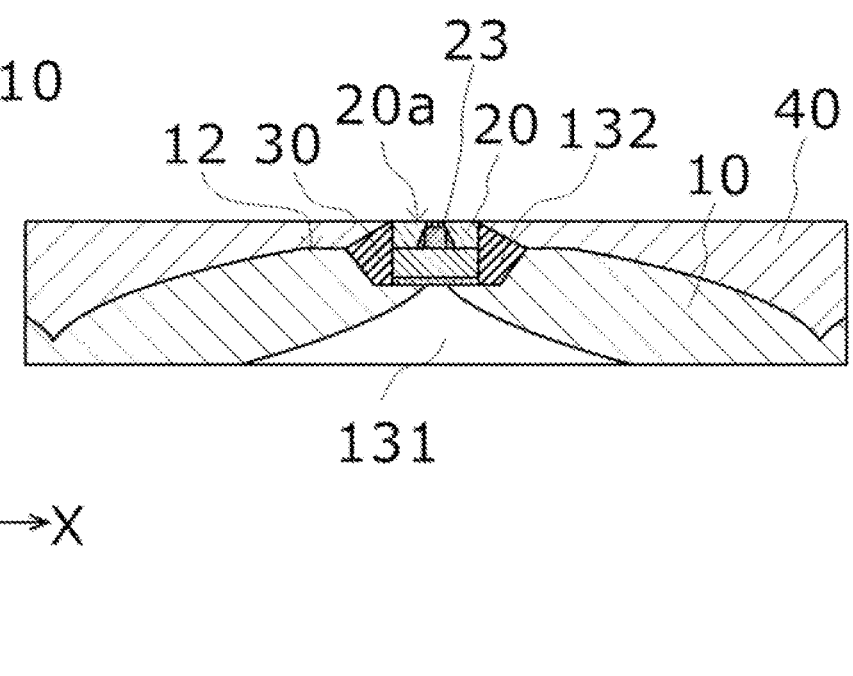
FIG. 10 is a partially enlarged schematic cross-sectional view showing an example of the steps for manufacturing the light emitting module according to the first embodiment of the present disclosure.

Next, as shown in FIG. 10, a light reflective member 40 is formed so as to cover the second main surface 12 of the light guide plate 10. The light reflective member 40 can be formed, for example, by forming a liquid light reflective member 40 by transfer molding, compression molding, potting, printing, spraying, or another such method, and curing the liquid. Also, the light reflective member 40 may be obtained by using an adhesive or the like to affix a sheet-form light reflective member 40 that has already been cured to the light guide plate 10.

The light reflective member 40 is formed such that the first surface 20a of the light source 20 is exposed. In particular, the light reflective member 40 is formed such that the electrodes 23 are exposed. Alternatively, the light reflective member 40 is formed so as to cover the first surface 20a of the light source 20, after which a part of the light reflective member 40 may be removed by blasting or with a grindstone or the like to expose the electrodes 23.

Step of Forming Wiring Layer

Next, the light emitting module 100 shown in FIG. 3B, etc., can be formed by forming a wiring layer 60 on the electrodes 23 of the light source 20 and on the light reflective member 40.

Silver, nickel, gold, ruthenium, titanium, platinum, or another such conductive material can be used in a single layer, or multiple layers, as the material of the wiring layer 60, for example. The laminated structure can be, for example, Ag/Cu, Ni/Au, Ni/Ru/Au, Ti/Pt/Au, or the like. Alternatively, a composite material such as copper coated with silver may be used. Examples of the method for forming the wiring layer 60 include sputtering, plating, printing of a conductive paste using the above-mentioned conductive material, affixing a metal foil, and the like. The wiring layer 60 can be formed in advance in the desired pattern. Alternatively, after the wiring layer 60 is formed covering the entire surfaces of the electrodes 23 and the light reflective member 40, part of this layer may be removed to form the wiring layer 60 in the desired pattern.

In the case where the light emitting module 100 includes a plurality of light sources 20, the light sources 20 may be wired so as to be independently driven. Also, the light guide plate 10 may be divided up into a plurality of ranges, the plurality of light sources 20 mounted in one range may be defined as one group, and the plurality of light sources 20 in one group may be electrically connected in series or in parallel and thereby connected in the same circuit, so that a plurality of such light source groups are provided. Grouping the light sources in this way affords a light emitting module capable of local dimming. In the example shown in FIG. 3A, of the four light sources 20, two are connected in series on the right side, and two are connected in series on the left side. These two serially connected sets are further connected in parallel.

The light emitting module 100 obtained as above and the wiring of the wiring board 200 can be bonded together using an adhesive sheet or the like. This yields the planar light source 1400 as shown in FIG. 1. The wiring of the wiring board 200 is electrically connected to external terminals 61 and 62 of the wiring layer 60 of the light emitting module 100. Then, the four light sources 20 can be simultaneously lit when power is supplied.

Here, an example is given in which the wiring layer 60 is disposed so that the four light sources 20 are switched on at the same time. However, this is not the only option, and the wiring layer 60 may be such that a single light source 20 can be lit individually.

The wiring board 200 may be joined to the light emitting module 100 by any method. For instance, an adhesive sheet can be disposed between the surface of the light reflective member 40 provided on the opposite side of the light guide plate 10 and the surface of the wiring board 200, and these can be press-bonded to join the two surfaces. Also, the wiring of the wiring board 200 and the light source 20 may be electrically connected by any method. For instance, a conductive member that consists of metal embedded in a via hole can be melted by pressure and heat to be joined to the wiring.

Second Embodiment

Figure 11:
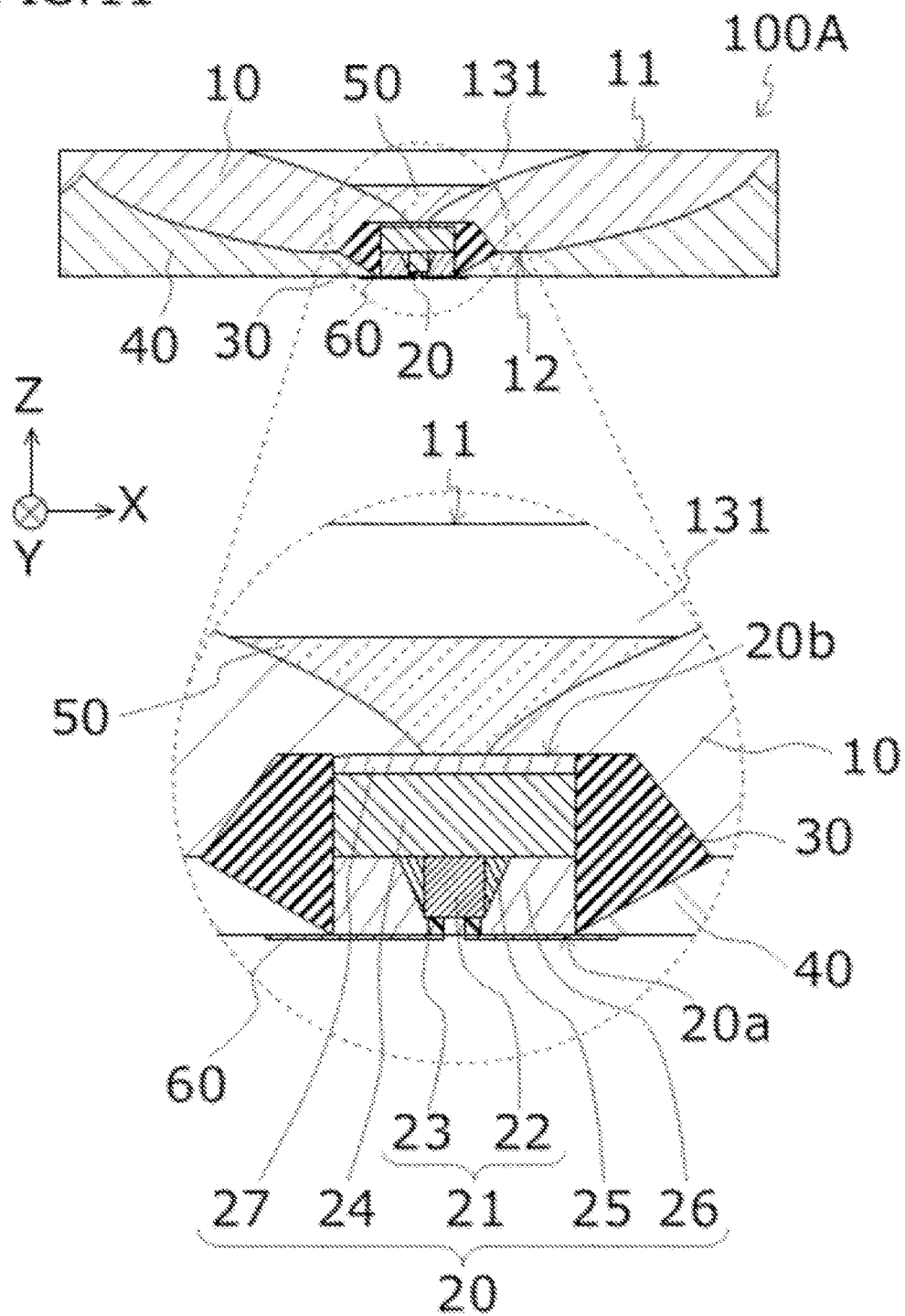
FIG. 11 is a partially enlarged schematic cross-sectional view and a schematic bottom view showing an example of the light emitting module according to a second embodiment of the present disclosure.

FIG. 11 shows a light emitting module 100A according to the second embodiment. The light emitting module 100A is different in that a light adjusting member (second light adjusting member) 50 is provided in the first penetration portion 131 of the light emitting module 100 shown in FIG. 3B, etc. The rest of the configuration and the manufacturing method are the same as those in the first embodiment, and will not be described again.

Step of Forming Second Light Adjusting Member

The second light adjusting member 50 can be formed after the step of joining the light source 20 and the light guide plate 10 in the first embodiment. That is, this member can be formed after the light guide plate 10 is turned upside down and the first penetration portion 131 is disposed facing up, following the step shown in FIG. 8 or 9. Alternatively, the second light adjusting member 50 can be formed after the light reflective member 40 has been formed in the first embodiment, or after the wiring layer 60 has been formed.

In the case where the second light adjusting member 50 is formed, such as in the case where a liquid second light adjusting member 50 is used, it can be formed by transfer molding, compression molding, potting, printing, spraying, or another such method, and then curing. Also, the second light adjusting member 50 can be obtained by using an adhesive or the like to affix a sheet-form light adjusting member 50 that has already been cured to the light guide plate 10.

Third Embodiment

Figure 12:
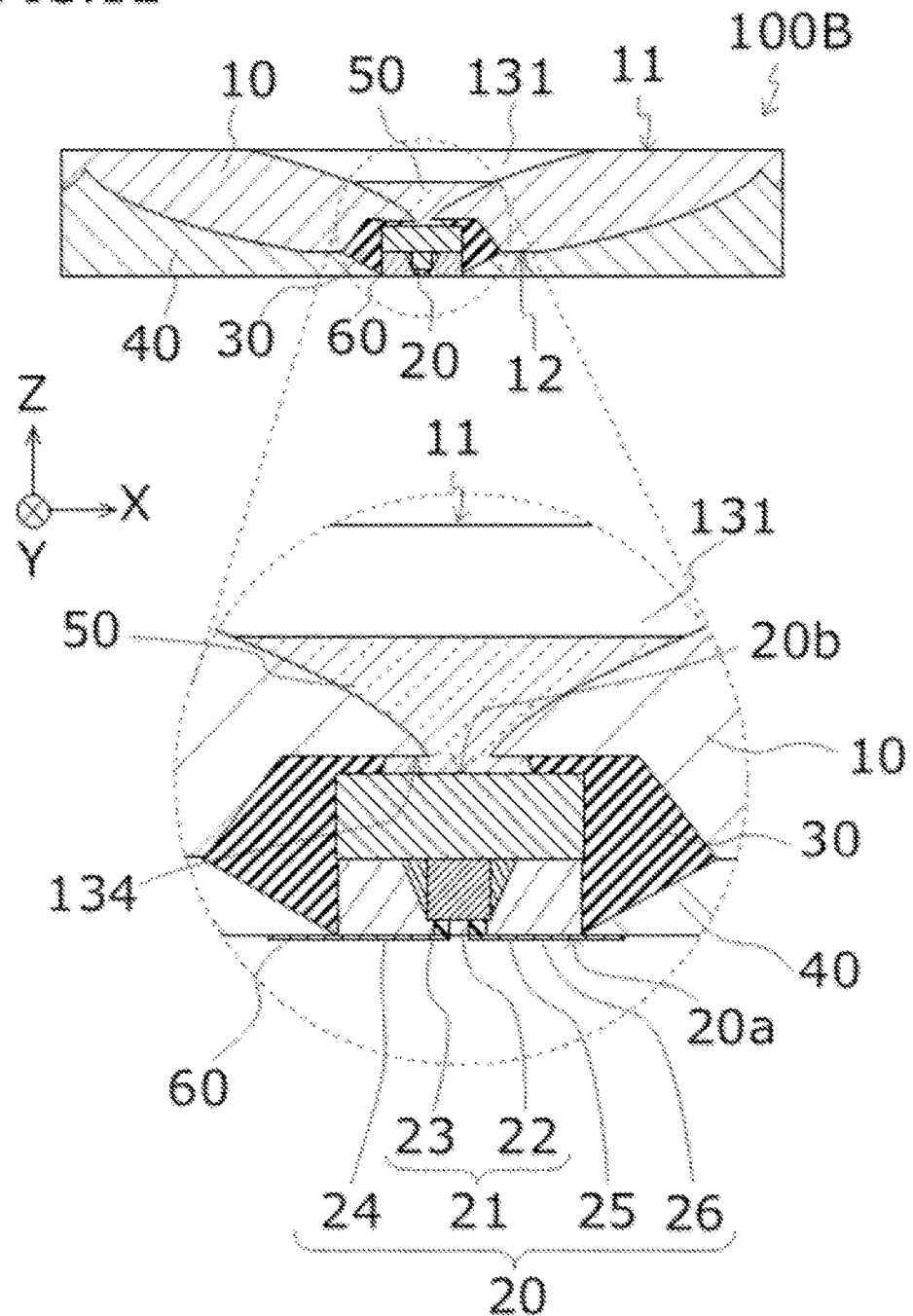
FIG. 12 is a partially enlarged schematic cross-sectional view and a schematic bottom view showing an example of the light emitting module according to a third embodiment of the present disclosure.

FIG. 12 shows a light emitting module 100B according to the third embodiment. The light emitting module 100B is similar to the light emitting module 100A shown in FIG. 11 in that the light adjusting member (second light adjusting member) 50 is disposed in the first penetration portion 131. With the light emitting module 100B, the second light adjusting member 50 is disposed so as to extend further into the interior of the intermediate penetration portion 133 and the second penetration portion 132. In other words, the light emitting module 100B includes the second light adjusting member 50 between the third surface 134 of the second penetration portion 132 and the light source 20. Thus, providing the second light adjusting member 50 extending from the first penetration portion 131 to the second penetration portion 132 improves adhesion between the second light adjusting member 50 and the light guide plate 10.

An example of the method for disposing the second light adjusting member 50 at this position is a method including a step of separating the light source 20 from the third surface 134 of the second penetration portion 132.

Figure 13:
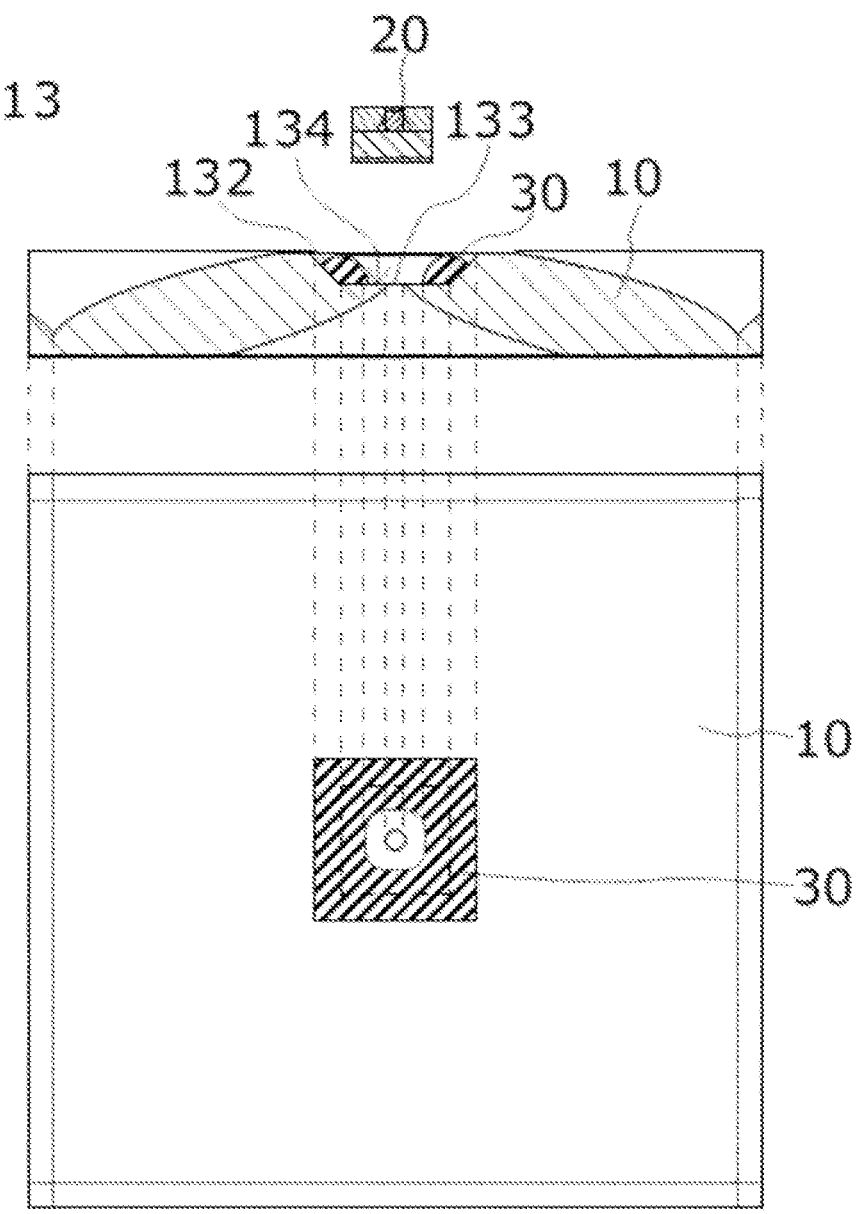
FIG. 13 is a partially enlarged schematic cross-sectional view showing an example of the steps for manufacturing the light emitting module according to the third embodiment of the present disclosure.
Figure 14:
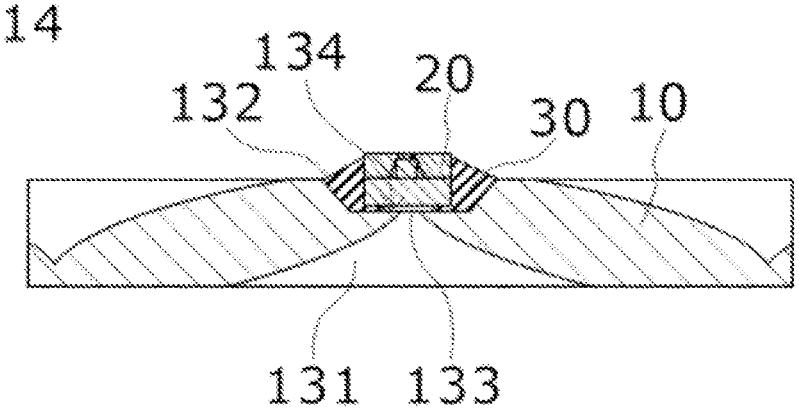
FIG. 14 is a partially schematic cross-sectional view showing an example of the steps for manufacturing the light emitting module according to the third embodiment of the present disclosure.

For example, as shown in FIG. 13, in the step of joining the light guide plate 10 and the light source 20, the joining member 30 is disposed on the third surface 134 of the second penetration portion 132 of the light guide plate 10, and light source 20 is disposed above this joining member 30. At this point, the light source 20 is disposed so that the second surface 20b of the light source 20 is facing up, and the first surface 20a of the light source 20 is opposite the third surface 134 of the second penetration portion 132. Consequently, as shown in FIG. 14, in the second penetration portion 132, a space is formed between the second surface 20b of the light source 20 and the intermediate penetration portion 133, or between the third surface 134 and the second surface 20b of the light source 20.

The joining member 30 can be disposed so as to be continuous from the third surface 134 of the second penetration portion 132 to the inner surface. Alternatively, the joining member 30 can be disposed only on the third surface 134.

In the case where a liquid joining member 30 is used, it can be disposed at a position that is away (spaced apart) from the intermediate penetration portion 133. For example, in the case where the joining member 30 is a liquid with a relatively low viscosity, disposing the joining member 30 at a position away from the intermediate penetration portion 133 will make it less likely that the joining member 30 will leak out from the intermediate penetration portion 133. Also, in the case of a liquid joining member 30 with a relatively high viscosity, it can be disposed at a position close to the intermediate penetration portion 133, or somewhere within the intermediate penetration portion 133.

The joining member 30 may be provided in advance on the second surface 20b of the light source 20. For example, the joining member 30 can be provided only on the second surface 20b that is disposed opposite the third surface 134. More specifically, an annular joining member 30 can be provided.

The joining member 30 provided to the light guide plate 10 or the light source 20 can also be a plate-shaped or sheet-form joining member 30 such as an adhesive sheet.

The light emitting module 100B as shown in FIG. 12 can be obtained by including a step of forming the second light adjusting member 50 after forming the space formed as described above has been formed in the second penetration portion 131.

Fourth Embodiment

Figure 15:
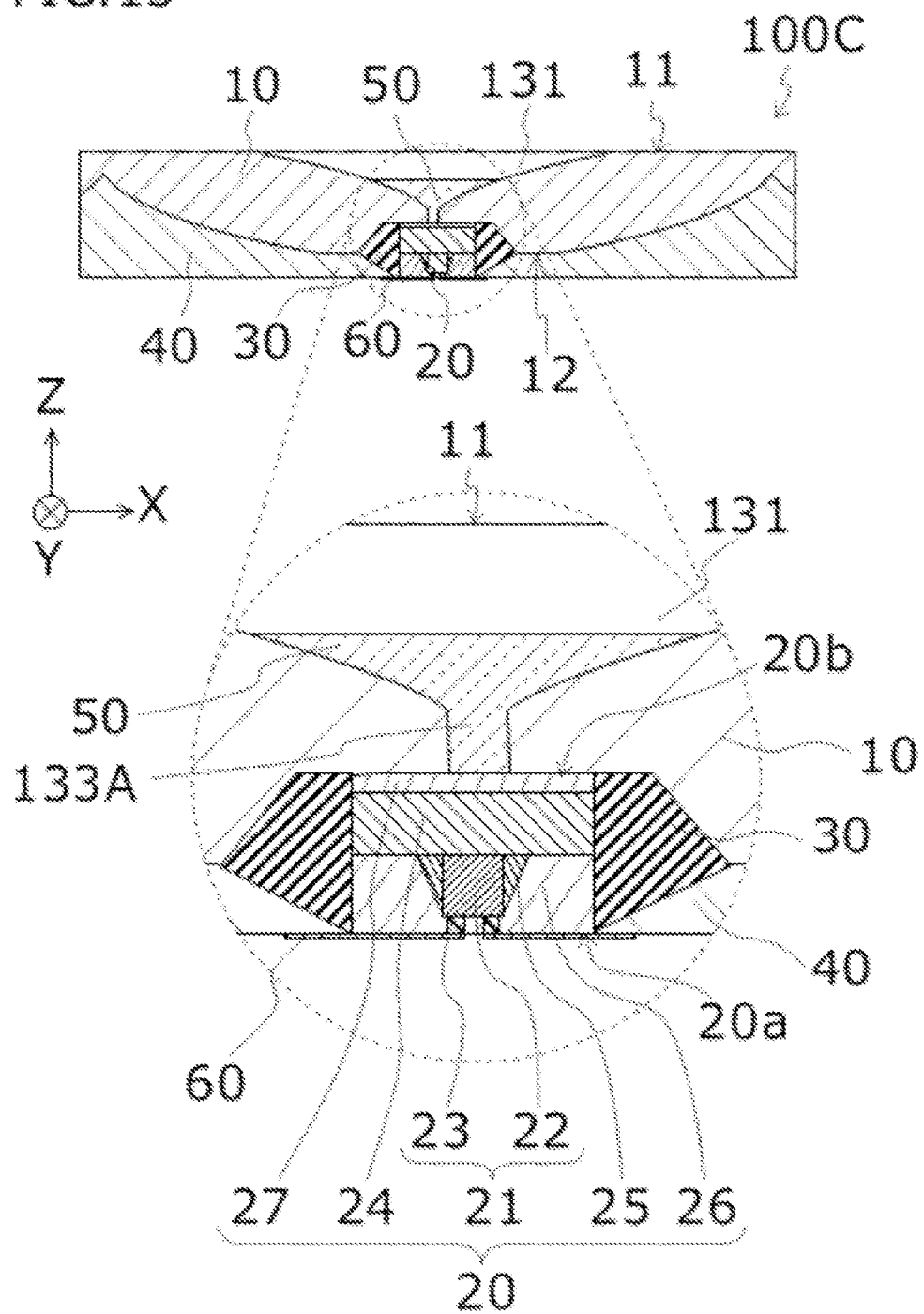
FIG. 15 is a partially enlarged schematic cross-sectional view and a schematic bottom view showing an example of the light emitting module according to a fourth embodiment of the present disclosure.

FIG. 15 shows a light emitting module 100C according to the fourth embodiment. The light emitting module 100C shows an example in which the height of the intermediate penetration portion 133A is different. The rest of the configuration and the manufacturing method can be the same as the configurations and manufacturing methods discussed in Embodiments 1 to 3.

The members constituting the light emitting module will now be described in detail.

Light Guide Plate 10

In the case where the light guide plate 10 is quadrangular in plan view, its size in plan view may be, for example, about 1 cm to 200 cm along one side, and preferably about 3 cm to 30 cm. The thickness of the light guide plate 10 can be about 0.1 mm to 5 mm, and preferably 0.5 mm to 3 mm. In the case where there are recesses and protrusions on the first main surface 11 and the second main surface 12, for example, the term "thickness" here means the thickness in the case where it is assumed that these recesses and protrusions are not there. For example, as shown in FIG. 4B, the thickness H between the first main surface 11 and the second main surface 12 around the through-hole 13 is the thickness of the light guide plate 10. The planar shape of the light guide plate 10 can be, for example, square, rectangular, or another quadrangular shape. Alternatively, it may be triangular, hexagonal, octagonal, or another such polygonal shape, or circular, elliptical, etc. Furthermore, it can have a shape that combines the above shapes, a shape in which a part is rounded, a shape in which a part is eliminated, or the like.

The material of the light guide plate 10 can be a resin material such as acrylic, polycarbonate, cyclic polyolefin, polyethylene terephthalate, polyester, or another such thermoplastic resin, or epoxy, silicone, or another such thermosetting resin, or can be an optically transparent material such as glass. A thermoplastic resin material is particularly favorable because it can be efficiently manufactured by injection molding. Polycarbonate, which has high transparency and is low in cost, is especially favorable. Also, the cost of the light emitting module can be reduced by using an inexpensive material such as polyethylene terephthalate. Also, using polyethylene terephthalate allows the shape of the light guide plate 10 to be formed stably and easily. Furthermore, polyethylene terephthalate has higher heat resistance than polycarbonate, so reliability is better.

The light guide plate 10 may be formed as a single layer, or may be formed by stacking a plurality of light-transmissive layers. In the case of stacking a plurality of light-transmitting layers, the layers can be affixed with an adhesive. Also, in the case where a plurality of light-transmissive layers are stacked, some or all of the layers can have a through-hole or a recess, creating a structure in which an air layer is provided inside the light guide plate. This allows a light emitting module to be obtained in which the light can be more easily diffused and there is less unevenness in luminance.

Through-Hole

The through-hole 13 is a portion that goes from the first main surface 11 to the second main surface 12 of the light guide plate 10, and inside of which the light source 20 is disposed. At least one through-hole 13 is provided to one light guide plate 10.

In the case where a plurality of through-holes 13 are provided, the through-holes 13 are arranged two-dimensionally in a plan view of the light guide plate 10. Preferably, the plurality of through-holes 13 are arranged two-dimensionally along two perpendicular directions, that is, the x direction (lateral direction) and the y direction (longitudinal direction). For example, as shown in FIGS. 2A and 2B, etc., the arrangement pitch of the through-holes 13 in the x direction and the arrangement pitch in the y direction may be the same or different. Also, the two directions of the layout need not be perpendicular to each other. Also, the arrangement pitch in the x direction or the y direction is not limited to being a regular spacing, and may instead be an irregular spacing. For example, the through-holes 13 may be arranged such that their spacing increases from the center of the light guide plate 10 toward its periphery.

One through-hole 13 has a first penetration portion 131 disposed on the first main surface 11 side, a second penetration portion 132 disposed on the second main surface 12 side, and an intermediate penetration portion 133 that connects the first penetration portion 131 and the second penetration portion 132. In other words, the through-hole 13 has the first penetration portion 131, the intermediate penetration portion 133, and the second penetration portion 132 disposed in that order in the thickness direction of the light guide plate 10 starting from the first main surface 11 side, which is the light extraction surface.

The first penetration portion 131 is disposed on the first main surface 11 side of the light guide plate 10. The main function of the first penetration portion 131 is spreading the light from the light source 20 laterally.

The opening of the first penetration portion 131 can be circular or elliptical in plan view. Alternatively, it can be a square, a rhombus, a rectangle, or another such quadrangular shape. Furthermore, it can be a triangle, a hexagon, an octagon, or another such polygonal shape. The first penetration portion 131 can be a space in the shape of a truncated cone provided with one of these openings. For instance, in the example shown in FIG. 4A, the first penetration portion 131 is a truncated cone-shaped space.

The width of the first penetration portion 131 on the first main surface 11 side is greater than the width on the intermediate penetration portion 133 side. It is particularly favorable for the width of the first penetration portion 131 to be greatest at the opening end on the first main surface 11 side, and narrowest on the intermediate penetration portion 133 side. Furthermore, it is preferable for the width to gradually decrease moving from the opening end on the first main surface 11 side toward the intermediate penetration portion 133. In other words, it is preferable for the inner surface of the first penetration portion 131 to be a surface that is inclined so that the width on the first main surface 11 side increases in a cross-sectional view. The width of the opening of the first penetration portion 131 is preferably greater than the width of the opening of the second penetration portion 132. The width (inside diameter) of the first penetration portion 131 on the intermediate penetration portion 133 side is preferably equal to the width (inside diameter) of the intermediate penetration portion 133.

The inner surface of the first penetration portion 131 can be linear or curved in cross-sectional view. Also, the inner surface of the first penetration portion 131 may be one continuous straight line or curve in cross-sectional view, may include a plurality of straight lines having different inclined surfaces, may include a plurality of curved lines having different curvatures, or may be a plurality of lines having steps. In the example shown in FIG. 3B, the inner surface of the first penetration portion 131 is a convex curved surface that is convex on the central axis side. The inner surface of the first penetration portion 131 is preferably a rotating body that is obtained by rotating the above-mentioned straight line or curved line around the central axis.

The angle of the inner surface of the first penetration portion 131 can be, for example, 1 degree to 90 degrees, and preferably 30 degrees to 45 degrees, with respect to the first main surface 11. In the case where the inner surface of the first penetration portion 131 is a curved line in a cross-sectional view, the angle between an imaginary line connecting the end (opening end) on the first main surface 11 side and the end on the intermediate penetration portion 133 side is preferably within the above range. Also, the inner surface of the first penetration portion 131 is preferably curved in a cross-sectional view. Furthermore, in a cross-sectional view, the inner surface is preferably curved so as to be convex with respect to the central axis of the first penetration portion 131. In particular, it is preferable for the curvature of the inner surface of the first penetration portion 131 above the light source 20 to be less than the curvature of the inner surface located outside the light source 20. The curvature of the inner surface of the first penetration portion 131 above the light source 20 is preferably less than the width of the light source 20. The curvature of the inner surface of the first penetration portion 131 located outside the light source 20 is preferably at least twice as large as the curvature of the inner surface above the light source 2.

The second penetration portion 132 is disposed on the second main surface 12 side of the light guide plate 10. The second penetration portion 132 is the portion where the light source 20 is disposed.

The opening of the second penetration portion 132 can be circular or elliptical in plan view. Alternatively, it can be a square, a rhombus, a rectangle, or another such quadrangular shape. Furthermore, it can be a triangle, a hexagon, an octagon, or another such polygonal shape. The second penetration portion 132 can be a space in the form of a truncated cone or a column provided with one of these openings. For instance, in the example shown in FIG. 4A, the second penetration portion 132 is a space in the form of a truncated quadrangular pyramid.

The width of the second penetration portion 132 on the second main surface 12 side is greater than the width on the intermediate penetration portion 133 side. In particular, the width of the second penetration portion 132 is preferably greatest at the opening end on the second main surface 12 side, and narrowest on the intermediate penetration portion 133 side. Furthermore, the width preferably decreases gradually moving from the opening end on the second main surface 12 side toward the intermediate penetration portion 133. In other words, it is preferable for the inner surface of the second penetration portion 132 to be a surface that is inclined so that the width on the second main surface 12 side increases in a cross-sectional view. The width of the opening of the second penetration portion 132 is preferably greater than the width of the light source 20. The width of the opening of the second penetration portion 132 can be 100% to 200% of the width of the light source 20, for example.

The inner surface of the second penetration portion 132 can be linear or curved in a cross-sectional view. Also, the inner surface of the second penetration portion 132 may be one continuous straight line or curved line in a cross-sectional view, may include a plurality of straight lines having different inclined surfaces, may include a plurality of curved lines having different curvatures, or may be a plurality of lines having steps. In the example shown in FIG. 3B, the inner surface of the second penetration portion 132 is linear. The second penetration portion 132 can be a space in the form of a truncated cone or a cylinder, for example. More specifically, in the case where the shape of the opening of the second penetration portion 132 is quadrangular in plan view, in the case where the inner surface is linear in a cross-sectional view, the second penetration portion 132 will be a space in the form of a square prism or a truncated square pyramid. Alternatively, in the case where the shape of the opening of the second penetration portion 132 is circular, in the case where the inner surface of the second penetration portion 132 is linear in a cross-sectional view, the second penetration portion 132 can be a space in the form of a cylinder or a truncated cone. Also, the inner surface of the second penetration portion 132 can be a rotating body obtained by rotating the above-mentioned straight line, curved line, etc., around the central axis.

The angle of the inner surface of the second penetration portion 132 is preferably 45 degrees to 90 degrees with respect to the second main surface 12, for example. In the case where the inner surface of the second penetration portion 132 is a curved line in a cross-sectional view, the angle between an imaginary line connecting the end (opening portion) on the second main surface 12 side and the end on the intermediate penetration portion 133 side is preferably within the above range.

The width (inside diameter) of the second penetration portion 132 on the intermediate penetration portion 133 side is preferably greater than the width (inside diameter) of the intermediate penetration portion 133. That is, as shown in FIG. 4B, etc., the second penetration portion 132 preferably has a third surface 134 that is parallel to the second main surface 12 or the first main surface 11. The second penetration portion 132 is connected to the intermediate penetration portion 133 within the third surface 134. The third surface 134 is preferably wider than the width of the light source 20.

The third surface 134 of the second penetration portion 132 is a surface on which the joining member 30 for joining the light source 20 and the light guide plate 10 can be disposed.

The intermediate penetration portion 133 is a part that connects the first penetration portion 131 and the second penetration portion 132. That is, the intermediate penetration portion 133 is disposed at a location that is away from the first main surface 11 and the second main surface 12 of the light guide plate 10. The intermediate penetration portion 133 can be used, for example, as a positioning part (marker) when the light source 20 is installed in the second penetration portion 132.

The intermediate penetration portion 133 can be circular or elliptical in plan view. Alternatively, it may be a square, a rhombus, a rectangle, or another such quadrangular shape. Furthermore, it can be a triangle, a hexagon, an octagon, or another such polygonal shape. The intermediate penetration portion 133 can be a space in the form of a truncated cone or a cylinder provided with one of these openings.

In the case where the first penetration portion 131 and the second penetration portion 132 are in contact with each other, the portion where they come into contact is the intermediate penetration portion 133. That is, in the case where the end of the first penetration portion 131 coincides with the intermediate penetration portion 133, the shape of the first penetration portion 131 in plan view is the same as the shape of the intermediate penetration portion 133 in plan view. For example, in the example shown in FIG. 4A, etc., the plan view shape of the intermediate penetration portion 133 is circular.

The width (inside diameter) of the intermediate penetration portion 133 is less than the width of the second surface 20b of the light source 20. In the case where a light emitting device is used as the light source 20, the width of the intermediate penetration portion 133 is preferably about the same as the width of the light emitting element 21, for example.

The inner surface of the intermediate penetration portion 133 can be linear or curved in a cross-sectional view. Also, the inner surface of the intermediate penetration portion 133 may be one continuous straight line or curved line in cross-sectional view, may include a plurality of straight lines having different inclined surfaces, may include a plurality of curved lines of different curvatures, or may be a plurality of lines having steps.

The depth of the first penetration portion 131 in the thickness direction of the light guide plate 10 can be 10% to 80% of the thickness of the light guide plate 10, for example. The depth of the second penetration portion 132 can be a depth that allows at least part of the light source 20 to be disposed therein. For example, it can be 30% to 100% of the height of the light source 20. Also, in the case where the light source 20 is a light emitting device, it is preferable for the height to be the height at which the light-transmissive member 24 of the light source 20 is disposed in the second penetration portion 132. In the case where the light source 20 is a light emitting device and the light-transmissive member 24 is located to the side of the light emitting element 21, all of the light source 20 may be disposed in the second penetration portion 132. Alternatively, the depth of the second penetration portion 132 can be 10% to 30% of the thickness of the light guide plate 10. The depth of the first penetration portion 131 is preferably greater than the depth of the second penetration portion 132.

The thickness of the intermediate penetration portion 133 can be 0% to 30% in the thickness direction of the light guide plate 10, for example. in the case where the thickness of the intermediate penetration portion 133 is 0%, that is, in the case where there is no thickness, this means that the first penetration portion 131 and the second penetration portion 132 are in contact with each other. For example, in the case where the first penetration portion 131 includes a narrow part that is narrower than the opening end of the first main surface 11, and the second penetration portion 132 has a narrow part that is narrower than the opening end of the second main surface 12, and these narrow parts are in contact with each other, these narrow parts serve as the intermediate penetration portion 133. The depth of the intermediate penetration portion 133 can also be said to be equal to the distance between the first penetration portion 131 and the second penetration portion 132. The intermediate penetration portion 133 can be shorter than the length of the first penetration portion 131 and shorter than the length of the second penetration portion 132, for example.

In plan view, the center of the first penetration portion 131, the center of the second penetration portion 132, and the center of the intermediate penetration portion 133 preferably line up with the optical axis of the light source 20. In this case, a deviation of about 2% to 30% of the width of the light source 20 is permissible. Also, the positions of the center of the first penetration portion 131, the center of the second penetration portion 132, and the center of the intermediate penetration portion 133 may be intentionally shifted to depend on the position of the light guide plate 10.

Concave Portion: Reflector

The light guide plate 10 may be a flat surface, except for the through-holes 13 on the second main surface 12. Alternatively, as shown in FIG. 4B, etc., a concave portion 14 that surrounds the through-hole 13 can be provided. In other words, the concave portion 14 can be provided between adjacent through-holes 13. The side surface of the concave portion 14 can function as a reflector that reflects the light from the light source 20 disposed in the through-hole 13 toward the first main surface 11 side. Therefore, a concave portion 14 is preferably disposed for each through-hole 13 in which a light source 20 is disposed in top view.

In plan view, the end of the concave portion 14 surrounding one through-hole 13 can coincide with the end of the concave portion 14 surrounding an adjacent through-hole 13. For example, as shown in FIG. 4A, etc., the concave portion 14 between two through-holes 13 has the lowest portion in the center between the two through-holes 13. The side surface located on the right side with this lowest portion in the center reflects the light from the light source 20 disposed in the through-hole 13 located on the right side. Similarly, the side surface located on the left side with the lowest portion in the center reflects light from the light source 20 disposed in the through-hole 13 located on the left side.

The side surface of the concave portion 14 can be a straight or curved surface in a cross-sectional view, and furthermore may be a combination of these. In the case where the side surface of the concave portion 14 is a curved surface, the curvature thereof may be constant, or the surface may have the desired curvature depending on the location. For instance, with the concave portion 14 shown in FIG. 4B, etc., an example of a side surface is shown in which the curvature gradually changes from the second main surface 12 parallel to the first main surface 11, around the through-hole 13. The second main surface 12 need not have a surface parallel to the first main surface 11 around the through-hole 13. That is, the outer periphery of the concave portion 14 may coincide with the outer periphery of the through-hole 13 in plan view.

As shown in FIG. 4B, etc., the deepest part of the concave portion 14 can be located closer to the first main surface 11 than the third surface 134 of the second penetration portion 132. In other words, the deepest part of the concave portion 14 can be deeper than the second penetration portion 132.

The deepest part of the concave portion 14 is preferably located in the center between two adjacent through-holes 13.

For instance, in the light emitting module 100 shown in FIG. 3A, in the case where the four light sources 20 can be driven individually, quadrangular regions centered on each of the light sources 20 each become one light emitting region. That is, it is possible to perform area drive (local dimming) in which only a part of the light emitting module 100 emits light as needed. In such a case, providing the concave portion 14 makes it easier to discern the boundaries between the adjacent light emitting regions, as compared to a case where the concave portion 14 is not provided. That is, it is easier to improve the contrast between the light emitting regions and the non-light emitting regions with area drive.

A low-refractive index member having a lower refractive index than that of the light guide plate 10 can be disposed in the concave portion 14. This low-refractive index member can be, for example, air, a resin material, or a glass material. Furthermore, a light reflective member 40 (discussed below) may be disposed in the concave portion 14. The light reflective member 40 will be described later on.

Groove

The light guide plate 10 can be a flat surface on the first main surface 11, except for the through-holes 13. Alternatively, as shown in FIG. 16, grooves 15 that surround the through-holes 13 can be provided on the first main surface 11.

The light emitting module 100D shown in FIG. 16 includes four light sources 20, and the four light sources 20 can be individually driven. That is, four light emitting regions 10A are provided that individually emit light. Each light emitting region 10A is, for example, a quadrangular region centered on the light source 20, as indicated by the thick line in FIG. 16.

The groove 15 can be disposed at a position closer to the end 10B of the light emitting region 10A than the light source 20 in each light emitting region 10A. The end 10B of each light emitting region 10A is also the boundary with the adjacent light emitting region 10A. In the example shown in FIG. 16, the end 10B of the light emitting region 10A coincides with the deepest part of the concave portion 14 provided on the second main surface 12 side of the light guide plate 10. The groove 15 is disposed in each light emitting region 10A along a straight line serving as the end 10B of the light emitting region 10A.

Because these grooves 15 are provided, the light reflected by the concave portion 14 can be more readily reflected near the end 10B of the light emitting region 10A and emitted to the outside. Consequently, there is less likely to be a decrease in luminance at a position away from the light source 20, that is, near the end 10B of the light emitting region 10A. Also, the contrast between the light emitting area and the non-light emitting area can be improved when area drive is performed.

The concave portion 14 is not necessarily required. In the case where no concave portions 14 is provided, for example, in the case where the light sources 10 are disposed in a matrix in the longitudinal and lateral directions, the boundaries of the light emitting regions 10A can be imaginary straight lines that pass through the approximate centers between adjacent light sources 20, and can be straight lines in a lattice shape that is perpendicular to the longitudinal and lateral directions.

A light reflective member can be disposed inside the groove 15. This light reflective member can be the same material as the light reflective member disposed on the second main surface 12 side. The groove 15 can be V-shaped when in a cross-sectional view, as shown in FIG. 16. However, this is not the only option, and the groove may instead be U-shaped or the like.

The width of the opening of the groove 15 may be substantially the same over the entire circumference in plan view. Alternatively, the width of the opening of the groove 15 may vary depending on the position. For instance, in the case where four light emitting regions 10A are provided as shown in FIG. 16, the width of the cross-shaped groove 15 disposed between the adjacent light emitting regions 10A may be different from the width of the quadrangular groove 15 disposed in the portion surrounding the four light emitting regions 10A. Alternatively, in the case where three or more light sources are disposed in the longitudinal and horizontal directions as shown in FIG. 2A, in the case where a light emitting region is set up for each light source, the groove surrounding the light emitting region located in the peripheral portion may have a different width from that of the groove surrounding the light emitting region located near the center.

The width of the opening of the groove 15 can be about 0.1 mm to 0.5 mm, for example. Also, the depth of the groove 15 is preferably less than the depth of the first penetration portion 131 of the through-hole 13. In the case where the concave portion 14 is provided on the second main surface 12 side of the light guide plate 10, the groove depth preferably equal to or less than the depth from the first main surface 11 to the deepest part of the concave portion 14.

Light Source

FIGS. 5A to 5H and FIGS. 6A to 6P show examples of the light source 20 that can be used in the light emitting module according to an embodiment. Each light source 20 includes a first surface (lower surface) 20a provided with electrodes 23, and a second surface (upper surface) 20b on the opposite side from the first surface 20a.

A light emitting element 21 can be used as the light source 20. Alternatively, the light source 20 can be a light emitting device that includes the light emitting element 21 and a member that covers the light emitting element 21.

Figure 5A:
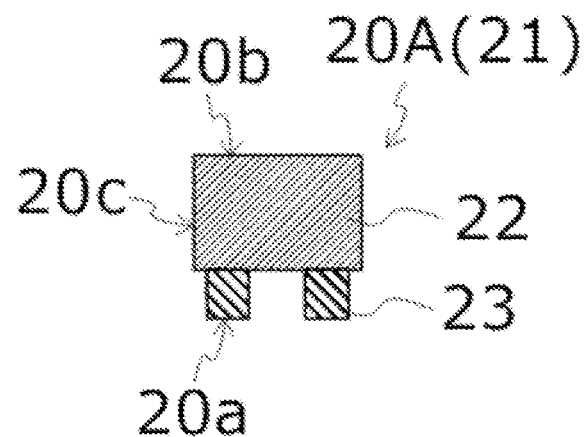
FIG. 5A is a schematic cross-sectional view showing an example of a light source according to the first embodiment of the present disclosure.

The light source 20A shown in FIG. 5A consists of just the light emitting element 21. The light emitting element 21 includes a semiconductor stacked-layer body 22 and a pair of electrodes 23 provided on the lower surface thereof. The first surface 20a of the light source 20A is the first surface 21a of the light emitting element 21. The second surface 20b of the light source 20A is the upper surface of the light emitting element 21. The side surface of the light source 20A is the side surface of the light emitting element 21.

A known semiconductor light emitting element such as a light emitting diode can be used as the light emitting element 21. The composition, emission wavelength, size, number, and so forth of the semiconductor stacked-layer body 22 of the light emitting element 21 to be used can be appropriately selected as dictated by the application. A light emitting element that emits light having any wavelength from ultraviolet light to visible light can be selected as the light emitting element 21. For example, for a light emitting element that emits ultraviolet, blue, or green light, a light emitting element featuring a nitride-based semiconductor ($In_xAl_yGa_{1-x-y}N$, $0 \leq X$, $0 \leq Y$, $X+Y \leq 1$) can be used as the semiconductor laminate 22. Examples of a light emitting element that emits red light include GaAs, GaP, and InP. The emission wavelength can be variously selected depending on the material of the semiconductor stacked-layer body 22 and the mixed crystallinity thereof. The shape of the semiconductor stacked-layer body 22 of the light emitting element 21 can be a square, a rectangle, or another such quadrangle, or a triangle, a hexagon, or another such polygon in plan view. The size of the light emitting element in plan view can be 50 μm to 1000 μm long on one side, for example. Also, the height of the light emitting element 21 can be 5 μm to 300 μm, for example. The electrodes 23 of the light emitting element 21 can be made of copper, gold, nickel, or the like, for example. The thickness of the electrodes 23 can be 0.5 μm to 100 μm, for example.

Figure 5B:
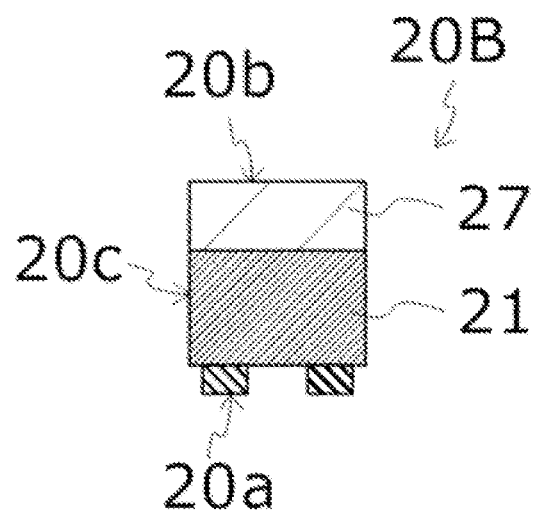
FIG. 5B is a schematic cross-sectional view showing a modified example of a light source according to the first embodiment of the present disclosure.
Figure 5C:
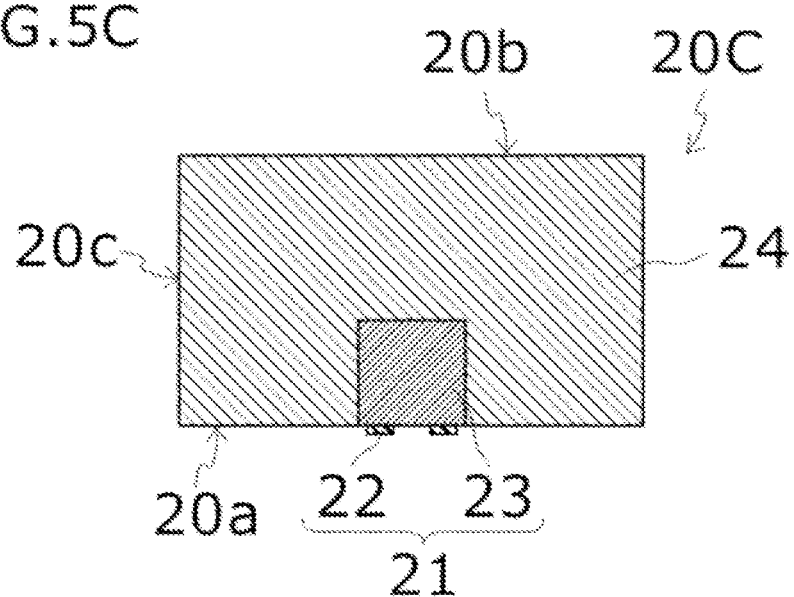
FIG. 5C is a schematic cross-sectional view showing a modified example of a light source according to the first embodiment of the present disclosure.
Figure 5D:
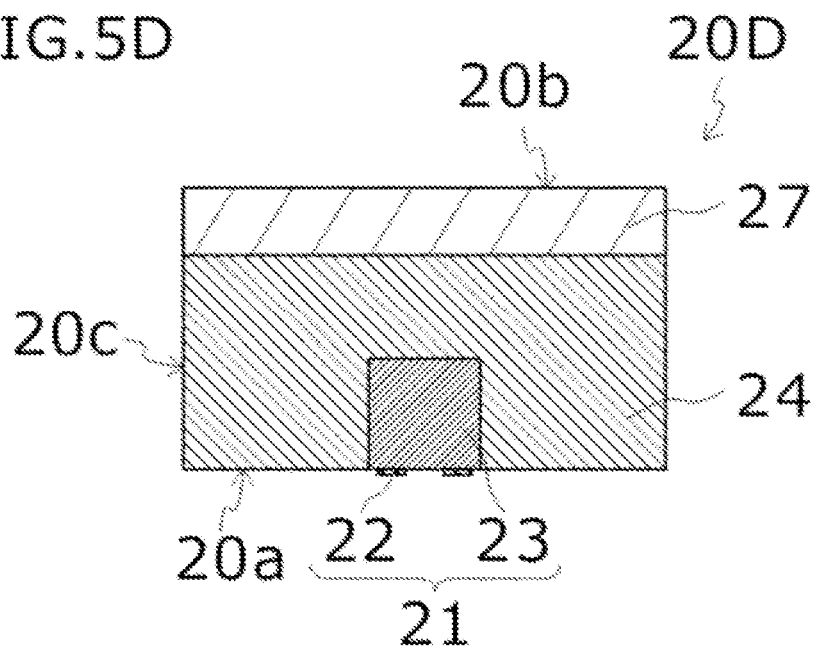
FIG. 5D is a schematic cross-sectional view showing a modified example of a light source according to the first embodiment of the present disclosure.
Figure 5E:
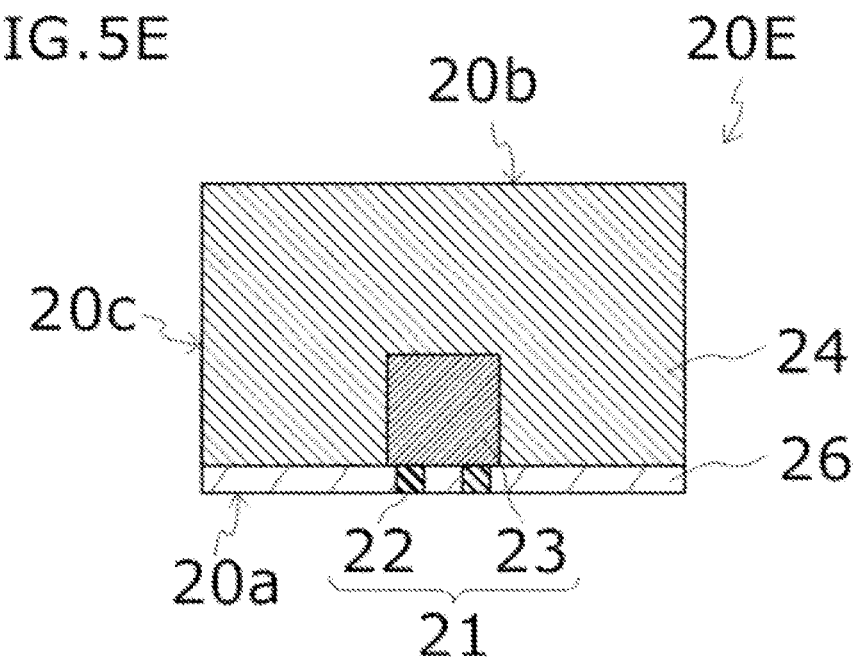
FIG. 5E is a schematic cross-sectional view showing a modified example of a light source according to the first embodiment of the present disclosure.
Figure 5F:
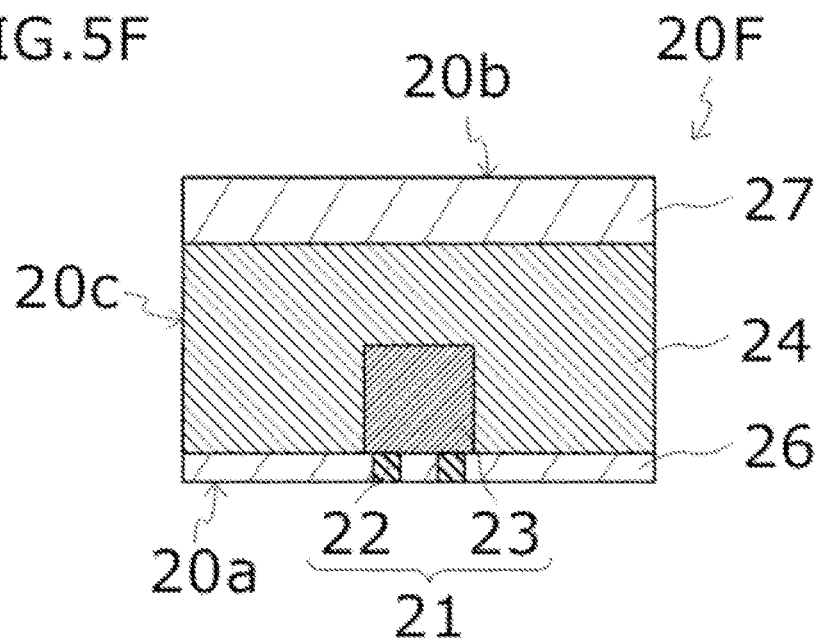
FIG. 5F is a schematic cross-sectional view showing a modified example of a light source according to the first embodiment of the present disclosure.
Figure 5G:
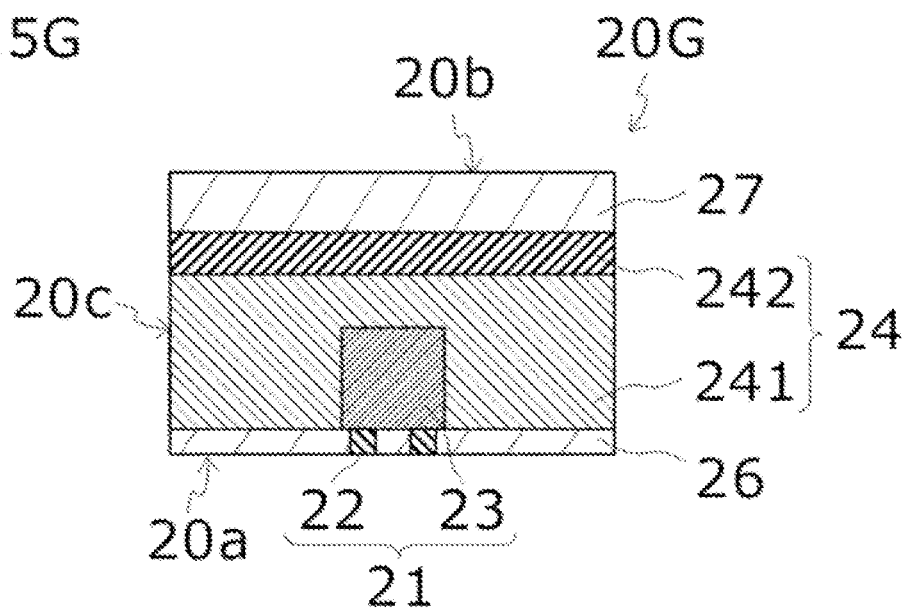
FIG. 5G is a schematic cross-sectional view showing a modified example of a light source according to the first embodiment of the present disclosure.
Figure 5H:
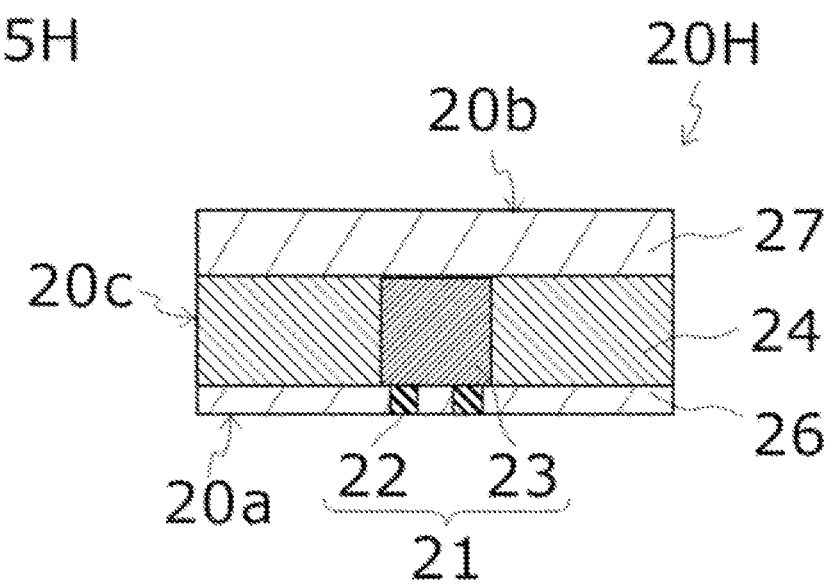
FIG. 5H is a schematic cross-sectional view showing a modified example of a light source according to the first embodiment of the present disclosure.
Figure 6C:
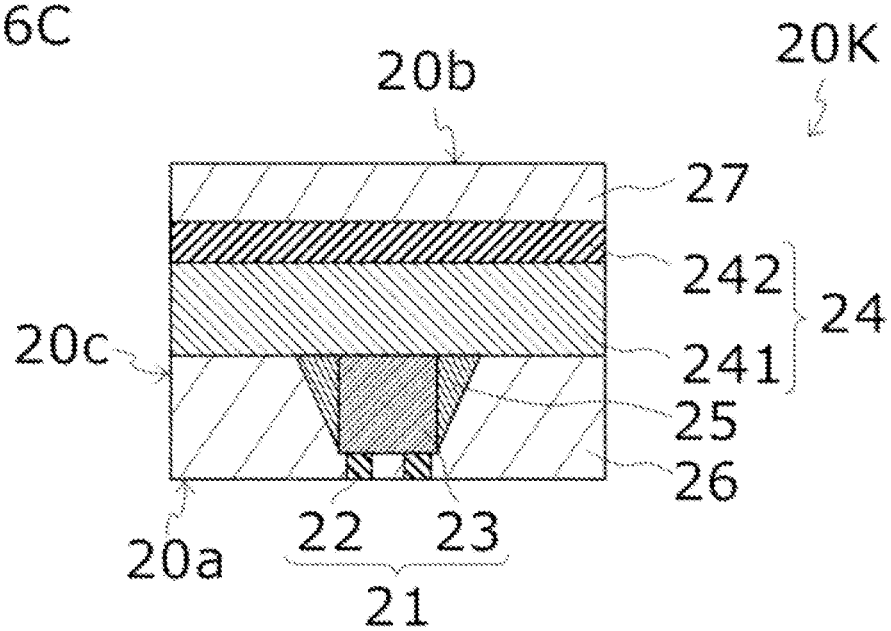
FIG. 6C is a schematic cross-sectional view showing a modified example of a light source according to the first embodiment of the present disclosure.
Figure 6D:
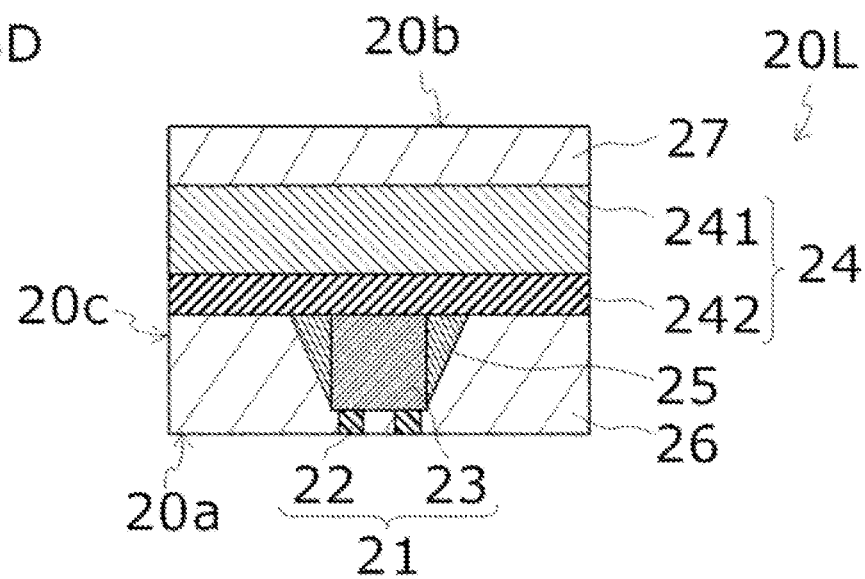
FIG. 6D is a schematic cross-sectional view showing a modified example of a light source according to the first embodiment of the present disclosure.
Figure 6E:
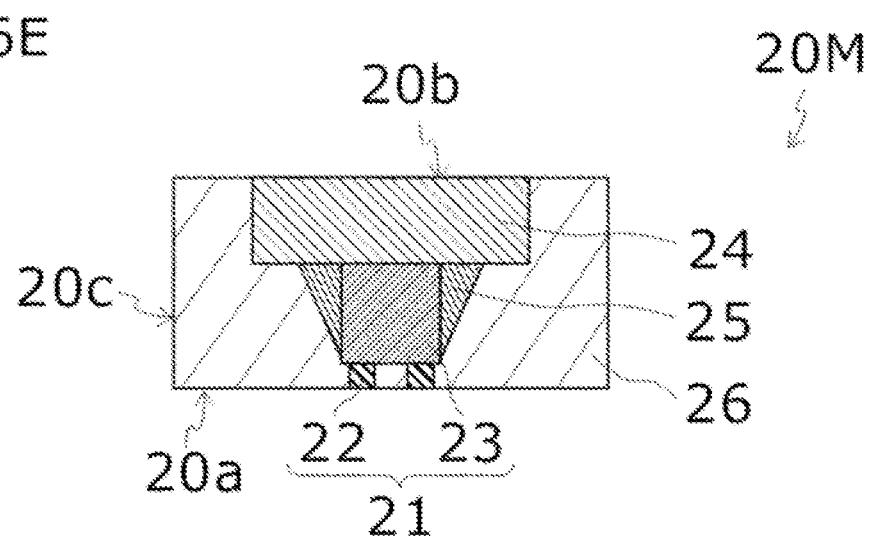
FIG. 6E is a schematic cross-sectional view showing a modified example of a light source according to the first embodiment of the present disclosure.
Figure 6F:
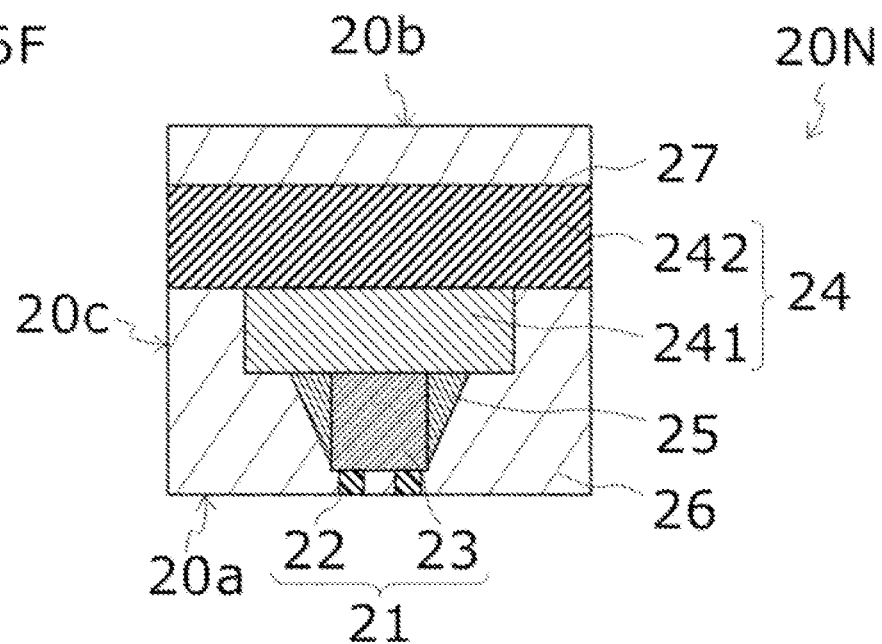
FIG. 6F is a schematic cross-sectional view showing a modified example of a light source according to the first embodiment of the present disclosure.

The light source 20B shown in FIG. 5B is a light emitting device having the light emitting element 21 and the light adjusting member 27 disposed thereon. The first surface 20a of the light source 20B is the lower surface of the light emitting element 21. The second surface 20b of the light source 20B is the upper surface of the light adjusting member 27. The side surface 20c of the light source 20B includes the light emitting element 21 and the light adjusting member 27.

The light sources 20C to 20H shown in FIGS. 5C to 5H are light emitting devices in which the side surface of the semiconductor stacked-layer body 22 of the light emitting element 21 is covered with the light-transmissive member 24. The light-transmissive member 24 constitutes a part of the side surface of the light source at the side of the light emitting element 21. Using a light source having such a structure allows the light emitted from the side of the light emitting element 21 to be easily emitted toward the side of the light source. Disposing at least a part of the light-transmissive member 24 of the light source having this structure inside the second penetration portion 132 allows the light to be incident inside the light guide plate 10 from the inner surface of the second penetration portion 132.

Furthermore, in the light sources 20C to 20G, the upper surface of the light emitting element 21 is also covered by the light-transmissive member 24. Furthermore, the light-transmissive member 24 of the light sources 20G and 20K includes a two-layer structure of a first light-transmissive member 241 and a second light-transmissive member 242 disposed thereon. The light-transmissive member 24 of the light source 20L includes a two-layer structure of the second light-transmissive member 242 and the first light-transmissive member 241 laminated thereon. In the first light-transmissive member 241 and the second light-transmissive member 242, for example, the first light-transmissive member 241 can be a layer that contains a wavelength conversion substance, and the second light-transmissive member 242 can be a layer that contains substantially no wavelength conversion substance. Also, the layers may contain different wavelength conversion substances, or the same wavelength conversion substance. The light-transmissive member 24 may also have a structure of three or more layers. Furthermore, the light-transmissive member 24 that covers the side surface of the semiconductor stacked body 22 and the light-transmissive member 24 that covers the upper surface may be integrated or may be separate bodies. In the case of separate bodies, the light-transmissive members 24 of the same member may be used, or light-transmissive members 24 having different types or concentrations of wavelength conversion substance may be used.

In the light sources 20C and 20D, the electrodes 23 and the lower surface of the semiconductor stacked-layer body 22 of the light emitting element 21 are exposed from the light-transmissive member 24. In such a case, the electrodes 23 of the light emitting element 21 are preferably thin. The thickness of the electrodes 23 can be, for example, about 0.5

μm to 100 μm. With a structure such as this, the thickness of the light source can be reduced. Therefore, the light emitting module can be made thinner.

The light sources 201 to 20P shown in FIGS. 6A to 6G are light emitting devices in which a reflective covering member 26 is disposed on the side of the light emitting element 21. With a light source having this structure, the light from the light emitting element 21 can be easily controlled by the light adjusting members (the first light adjusting member 27 and a second light adjusting member 50).

The covering member 26 directly or indirectly covers the side surface of the semiconductor stacked-layer body 22 of the light emitting element 21. In the light sources 201 to 20N, the covering member 26 covers the side surface of the semiconductor stacked-layer body 22 of the light emitting element 21 via a light-transmissive adhesive member 25 that covers the side surface of the semiconductor stacked-layer body 22 of the light emitting element 21. However, this is not the only option, and the covering member 26 may be in contact with the side surface of the semiconductor stacked-layer body 22 of the light emitting element 21 as in the light source 20P.

With the light source 20M, the covering member 26 covers the side surface of the light-transmissive member 24. With this structure, light can be easily controlled by the light adjusting member (second light adjusting member 50) located on the upper surface of the light-transmissive member 24. With the light source 20N, of the light-transmissive member 24, the covering member 26 covers the side surface of the first light-transmissive member 241 on the lower layer side and the does not cover the side surface of the second light-transmissive member 242 on the upper layer side. With this structure, the light can be easily controlled by the light adjusting member 27.

In the light sources 201 to 20P, the light-transmissive member 24 and the light emitting element 21 are bonded by the light-transmissive adhesive member 25. The light-transmissive adhesive member 25 covers the side surface of the semiconductor stacked-layer body 22 of the light emitting element 21. The light-transmissive adhesive member 25 may be positioned between the light emitting element 21 and the light-transmissive member 24. Also, the light-transmissive adhesive member 25 may be omitted as shown in the light source 20P. An epoxy resin, a silicone resin, a resin obtained by mixing these, or the like can be used as the light-transmissive adhesive member 25.

The light source 20P includes a plurality of light emitting elements 21. Here, an example is given in which there are four light emitting elements 21 disposed in two columns and two rows. The number of light emitting elements 21 is not limited to this. The emission wavelengths of the light emitting elements 21 may be the same or different. For instance, in the upper diagram of FIG. 6G, a red light emitting element and a green light emitting element can be disposed starting from the left in the upper row, and a blue light emitting element and a red light emitting element can be disposed starting from the left in the lower row. In the case where light emitting elements of three colors which are the three primary colors of light are thus provided, the light-transmissive member 24 disposed on these need not include a wavelength conversion substance.

The light sources 20E to 20P include the reflective covering member 26 that covers the lower surface of the semiconductor stacked-layer body 22 of the light emitting element 21 and the side surface of the electrodes 23. That is, the first surface 20a of the light source is made up of the covering member 26 and the electrodes 23 of the light emitting element 21. This makes it less likely that the light from the light emitting element 21 will be absorbed by the wiring board or the like.

The light sources 20D, 20F, 20G, 20H, 20J, 20L, 20N, and 20P include the light adjusting member 27 above the light emitting element 21. In the light source 20H, the upper surface of the light emitting element 21 and the light adjusting member 27 are in contact with each other. The second surface 20b of each of these light sources is constituted by the light adjusting member 27. The light adjusting member 27 includes a light reflective member. Providing the light adjusting member 27 allows the amount of light emitted upward from the light source to be adjusted. Consequently, unevenness in luminance is reduced when viewed from the first main surface 11 side, which is the light extraction surface of the light emitting module 100, and the light emitting module 100 and the planar light source 1400 will have excellent uniformity.

A light source in which the bottom surface of the semiconductor stacked-layer body 22 of the light emitting element 21 and the side surfaces of the electrodes 23 are covered by the covering member 26 or the light-transmissive member 24 may include a metal layer such as a plating layer or a sputtered film that covers the electrodes 23. Examples of the material of the metal film include silver, nickel, gold, ruthenium, titanium, and platinum, which can be used in a single layer or in a stacked state. The stacked structure can be, for example, one in which Ag/Cu, Ni/Au, Ni/Ru/Au, Ti/Pt/Au, or Cu/Ni/Au are laminated in that order. The metal film may be disposed so as to continuously cover the electrodes 23 and a part of the light-transmissive member 24 or the covering member 26 that covers the side surfaces of the pair of electrodes 23.

Light-Transmissive Member

The light-transmissive member 24 has a light-transmissive property of transmitting at least the light from the light emitting element 21, and transmits at least 60%, and preferably at least 90%, of the light emitted from the light emitting element 21. A light-transmissive thermosetting resin material such as an epoxy resin or a silicone resin can be used as the material of the light-transmissive member 24.

The light-transmissive member 24 may include a particulate phosphor as a wavelength conversion substance in the above-mentioned resin material. The wavelength conversion substance includes phosphors that will convert the wavelength of light emitted from the light emitting element 21 into light of a different wavelength, and other such wavelength conversion substances. In the light-transmissive member 24, the layer that includes the wavelength conversion substance can be a single layer or a plurality of layers. Also, the light-transmissive member 24 can include a stacked-layer structure of a layer that contains a wavelength conversion substance and a layer that contains substantially no wavelength conversion substance.

Examples of the fluorescent substance include yttrium aluminum garnet-based phosphor (for example, $Y_3(Al,Ga)_5O_{12}$: Ce), lutetium aluminum garnet-based phosphor (for example, $Lu_3(Al,Ga)_5O_{12}$: Ce), and terbium-Aluminum garnet-based phosphor (for example, $Tb_3(Al,Ga)_5O_{12}$: Ce)-based phosphor, silicate-based phosphor (for example, $(Ba,Sr)_2SiO_4$: Eu), chlorosilicate-based phosphor (for example, $Ca_8Mg(SiO_4)_4Cl_2$: Eu). Further, as the nitride-based phosphor, a β-sialon-based phosphor (for example, $Si_{6-z}Al_zO_zA_{8-z}$: Eu (0<z<4.2)), and an α-sialon-based phosphor (for example, $M_z(Si,Al)_{12}(O,N)_{16}$ (0<z≤2, M is Li, Mg, Ca, Y, and a lanthanide element excluding La and Ce), nitrogen-containing calcium aluminosilicate (CAN or SCANSN)-based phosphor (e.g., (Sr, Ca)AlSiN$_3$: Eu) and the like. In the phosphor represented by the general formula $$Ma_xMb_yAl_3N_2: Eu \qquad (I)$$

(in the above general formula (I), Ma is at least one element selected from the group consisting of Ca, Sr and Ba, and Mb is at least one element selected from the group consisting of Li, Na and K, and x, y and z are 0.5≤x≤1.5, 0.5≤y≤1.2, and 3.5≤z≤4.5 respectively). Further, SGS-based phosphors (for example, SrGa$_2$S$_4$: Eu) can be mentioned. In addition, a manganese-activated fluoride-based phosphor (a phosphor represented by the general formula $$A_2(M_{1-a}Mn_aF_6) \qquad (II)$$

(in the above general formula (II), A is at least one selected from the group consisting of K, Li, Na, Rh, Cs and NH$_4$, M is at least one element selected from the group consisting of Group 4 elements and Group 14 elements, and a is 0<a<0.2). A typical example of the manganese-activated fluoride-based phosphor is a manganese-activated potassium fluoride silicate phosphor (for example, KSF (K$_2$SiF$_6$: Mn)).

One light-transmissive member can contain one kind or a plurality of kinds of phosphors. The two or more kinds of phosphor may be used as a mixture, or may be stacked. For example, a light-emitting element 21 that emits blue light can be used, and a β-sialon phosphor that emits green light and a fluoride phosphor such as a KSF phosphor that emits red light can be included as phosphors. Using two kinds of phosphor affords a broader color reproduction range for the light emitting module. Also, the phosphor may be quantum dots.

The phosphor may be disposed in any manner inside the light-transmissive member 24. For example, the phosphor may be distributed substantially uniformly inside the wavelength conversion member, or may be unevenly distributed.

The light-transmissive member 24 may include a light diffusing substance. Examples of light diffusing substances include microparticles of SiO$_2$, TiO$_2$, Al$_2$O$_3$, ZnO, and the like.

Coating Member

The covering member 26 is a light reflective member. The covering member 26 can have a reflectance of light emitted from the light emitting element 21 of at least 60%, for example, with at least 70% being preferable, and at least 90% being even better. The material of the covering member 26 is preferably a resin material containing a white pigment or the like. A silicone resin containing titanium oxide is particularly favorable.

Light Adjusting Member (First Light Adjusting Member)

The light adjusting member 27 is a light reflective member. The reflectance and transmittance of the light adjusting member 27 can be appropriately selected so as to obtain the desired light distribution according to the intensity of light emitted from the light emitting element 21, the thickness and size of the light guide plate 10, and so forth. For example, the reflectance with respect to the light from the light emitting element 21 can be, for example, 70% or more, and is preferably at least 80%. The material of the light adjusting member 27 is preferably a resin material containing a white pigment or the like. A silicone resin containing titanium oxide is particularly favorable. The thickness of the light adjusting member 27 can be, 30 μm to 200 μm, and preferably 50 μm to 100 μm, for example.

Joining Member

The joining member 30 is a member that joins the light source 20 and the light guide plate 10 together. The joining member 30 can be light-transmissive or reflective. For example, in the case where the second surface 20b of the light source 20 is provided with a reflective light adjusting member 27, making the joining member 30 light-transmissive makes it less likely that there will be unnecessary darkening above the light source 20. In the case where the second surface 20b of the light source 20 is provided with a reflective light adjusting member 27 and the transmittance of the light adjusting member 27 is higher than a certain numerical range, making the light adjusting member 27 reflective makes it less likely that there will be unnecessary brightening above the light source 20. That is, even if there is some variance in the luminance of the light source 20, the variance in luminance within the light emitting module 100 can be reduced by adjusting the transmittance or reflectance of the joining member 30. Therefore, in choosing the luminance of the light source 20, the allowable range can be expanded, and fewer defective products will result.

In the case where the joining member 30 is light-transmissive, the material of the joining member 30 can be an epoxy resin, a silicone resin, a resin in which these are mixed, glass, or another such light-transmissive material.

In the case where the joining member 30 is reflective, an epoxy resin, a silicone resin, a resin in which these are mixed, or a light-transmissive material such as glass can be used as the material of the base material of the joining member 30. Furthermore, a reflective substance can be mixed into these base materials. Examples of reflective substances include titanium oxide.

Light Reflective Member

The light reflective member 40 is a light reflective member that covers the one or more light sources 20 and the second main surface 12 of the light guide plate 10. Covering the entire second main surface 12 with the light reflective member 40 allows the light from the light source 20 to be efficiently brought into the light guide plate 10.

The light reflective member 40 has a reflectance of at least 60%, and preferably at least 90%, with respect to the light emitted from the light source 20. The material of the light reflective member 40 can, for example, be a metal, a white resin material, a DBR film, or the like. It is particularly favorable for the material of the light reflective member 40 to be a white resin material. Examples of white resin materials include a resin material containing titanium oxide as a reflective substance, and a foamed resin material. The resin material can be an epoxy resin, a silicone resin, polyethylene terephthalate, or other such light-transmissive thermosetting resin material.

Light Adjusting Member of Light Guide Plate

Second Light Adjusting Member

The light adjusting member 50 may be provided inside the first penetration portion 131 of the through-hole 13 of the light guide plate 10. The light adjusting member 50 preferably has the function of reflecting some of the light from the light source 20. The material of the light adjusting member 50 can be the same as the material of the light reflective member (first light adjusting member) 27 of the light source 20.

Wiring Board

The wiring board 200 has an insulating base material and wiring. The wiring is electrically connected to the plurality of light sources 20.

The wiring board 200 has, for example, a conductive member that fills a plurality of via holes provided to the insulating base material, and wiring that is electrically connected to the conductive member on both surface sides of the base material.

The wiring board 200 may have a stacked-layer structure. For example, a metal plate provided with an insulating layer on its surface may be used as the wiring board 200. The wiring board 200 may also be a TFT board having a plurality of TFTs (thin-film transistors).

The material of the base material of the wiring board can be, for example, a ceramic or a resin. A resin may be selected as the material of the base material in terms of low cost and ease of molding. Examples of resins include phenol resin, epoxy resin, polyimide resin, BT resin, polyphthalamide (PPA), polyethylene terephthalate (PET), unsaturated polyester, glass epoxy, and other such composite materials. This base may be a rigid board or a flexible board.

The wiring is, for example, a conductive foil (conductor layer) provided on the base material, and is electrically connected to the plurality of light sources 20. The wiring material preferably has high thermal conductivity. Examples of such a material include a single conductive material such as copper, gold, or silver, and alloys of these materials. Alternatively, a composite material such as copper coated with silver may be used. Also, the wiring can be formed by plating, applying a conductive paste using the above-mentioned conductive material, printing, or another such method, and the thickness of the wiring is about 5 µm to 50 µm, for example.

The light emitting module according to the present disclosure can be used, for example, as a backlight of a liquid crystal display device, various display devices, and the like.

It is to be understood that although certain embodiments of the present invention have been described, various other embodiments and variants may occur to those skilled in the art that are within the scope and spirit of the invention, and such other embodiments and variants are intended to be covered by the following claims

What is claimed is:

1. A method for manufacturing a light emitting module comprising:
    providing a light source including
        a first surface having a pair of electrodes, and
        a second surface on an opposite side from the first surface;
    providing a light guide plate including a first main surface and a second main surface on an opposite side from the first main surface, the light guide plate defining a through-hole extending through the light guide plate from the first main surface to the second main surface, the through-hole having
        a first penetration portion disposed on a first main surface side,
        a second penetration portion disposed on a second main surface side, and
        an intermediate penetration portion connecting the first penetration portion and the second penetration portion, the intermediate penetration portion being narrower in width than the second surface of the light source; and
    disposing the light source in the second penetration portion of the light guide plate with a joining member being interposed between the light source and the light guide plate, wherein
    the providing of the light guide plate includes providing the light guide plate having a third surface defining a part of the second penetration portion, the third surface being parallel to the second main surface or the first main surface and disposed around the intermediate penetration portion.

2. The method for manufacturing a light emitting module according to claim 1, wherein
    the disposing of the light source includes disposing the light source on the third surface.

3. The method for manufacturing a light emitting module according to claim 1, wherein
    the disposing of the light source includes disposing the joining member in the second penetration portion after disposing the light source in the second penetration portion so as to block off the intermediate penetration portion.

4. The method for manufacturing a light emitting module according to claim 1, wherein
    the disposing of the light source includes disposing the light source so as to block off the intermediate penetration portion after disposing the joining member in the second penetration portion.

5. The method for manufacturing a light emitting module according to claim 1, further comprising
    forming a reflective member so as to cover the second main surface of the light guide plate after the disposing of the light emitting device.

6. The method for manufacturing a light emitting module according to claim 1, further comprising
    forming a light reflective light adjusting member in the first penetration portion.

7. A light emitting module comprising:
    a light source including
        a first surface having a pair of electrodes, and
        a second surface on an opposite from the first surface;
    a light guide plate including a first main surface, and a second main surface on an opposite side from the first main surface, the light guide plate defining a through-hole extending through the light guide plate from the first main surface to the second main surface, the through-hole having
        a first penetration portion disposed on a first main surface side,
        a second penetration portion disposed on a second main surface side, and
        an intermediate penetration portion connecting the first penetration portion and the second penetration portion, the intermediate penetration portion being narrower in width than the second surface of the light source; and
    a joining member joining the light source and the light guide plate in the second penetration portion, wherein
    the light guide plate has a third surface defining a part of the second penetration portion, the third surface being parallel to the second main surface or the first main surface and disposed around the intermediate penetration portion.

8. The light emitting module according to claim 7, wherein
the joining member is disposed between the second surface of the light source and the third surface of the light guide plate.

9. The light emitting module according to claim 7, wherein
the joining member is disposed at a position spaced apart from the intermediate penetration portion.

10. The light emitting module according to claim 7, further comprising a light reflective light adjusting member disposed in the first penetration portion.

11. The light emitting module according to claim 10, wherein
the light reflective light adjusting member extends from the first penetration portion to the second penetration portion.

12. The light emitting module according to claim 7, further comprising
a light reflective member covering the second main surface.

13. The light emitting module according to claim 7, wherein
the light guide plate further defines an additional through-hole, and
the light guide plate defines a concave portion on the second main surface between the through-hole and the additional through-hole.

14. The light emitting module according to claim 13, further comprising
a light reflective member disposed in the concave portion.

15. The light emitting module according to claim 7, wherein
the light guide plate defines a groove on the first main surface, the groove surrounding the through-hole in a plan view.

* * * * *